United States Patent
Ikeda et al.

(10) Patent No.: US 8,551,557 B2
(45) Date of Patent: Oct. 8, 2013

(54) METHOD FOR MANUFACTURING LIGHT-EMITTING DEVICE

(75) Inventors: Hisao Ikeda, Kanagawa (JP); Takahiro Ibe, Kanagawa (JP); Yosuke Sato, Kanagawa (JP); Kohei Yokoyama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 668 days.

(21) Appl. No.: 12/166,002

(22) Filed: Jul. 1, 2008

(65) Prior Publication Data

US 2009/0011677 A1    Jan. 8, 2009

(30) Foreign Application Priority Data

Jul. 6, 2007    (JP) .................. 2007-179085

(51) Int. Cl.
     *B05D 5/06*      (2006.01)
     *C23C 16/00*      (2006.01)
     *H01L 21/00*      (2006.01)

(52) U.S. Cl.
     USPC .......... 427/69; 427/66; 427/255.23; 427/596; 118/726; 438/29

(58) Field of Classification Search
     USPC ............. 427/66, 69, 255.23, 255.6, 256, 258, 427/554, 595–596; 118/726
     See application file for complete search history.

(56) References Cited

U.S. PATENT DOCUMENTS

| | | | |
|---|---|---|---|
| 5,937,272 A * | 8/1999 | Tang ............................... 438/30 |
| 6,114,088 A | 9/2000 | Wolk et al. | |
| 6,140,009 A | 10/2000 | Wolk et al. | |
| 6,165,543 A | 12/2000 | Otsuki et al. | |
| 6,194,119 B1 | 2/2001 | Wolk et al. | |
| 6,214,520 B1 | 4/2001 | Wolk et al. | |
| 6,221,553 B1 | 4/2001 | Wolk et al. | |
| 6,270,944 B1 | 8/2001 | Wolk et al. | |
| 6,291,116 B1 | 9/2001 | Wolk et al. | |
| 6,291,126 B2 | 9/2001 | Wolk et al. | |
| 6,410,201 B2 | 6/2002 | Wolk et al. | |
| 6,582,876 B2 | 6/2003 | Wolk et al. | |
| 6,586,153 B2 | 7/2003 | Wolk et al. | |
| 6,703,179 B2 | 3/2004 | Tyan | |
| 6,939,660 B2 | 9/2005 | Tutt et al. | |
| 8,313,603 B2 | 11/2012 | Ikeda et al. | |
| 8,431,432 B2 | 4/2013 | Ikeda et al. | |

(Continued)

FOREIGN PATENT DOCUMENTS

| EP | 1 342 585 A1 | 9/2003 |
|---|---|---|
| EP | 1 344 652 A2 | 9/2003 |

(Continued)

*Primary Examiner* — James Lin
(74) *Attorney, Agent, or Firm* — Husch Blackwell LLP

(57) ABSTRACT

A method for manufacturing a light-emitting device including a layer containing different evaporation materials, by which a desired layer containing the different evaporation materials is formed easily using a plurality of evaporation materials. A light-emitting device is manufactured in such a manner that a plurality of layers each containing a different evaporation material from each other is stacked over a first substrate; a second substrate which has a first electrode is placed at a position facing the first substrate; the plurality of layers containing evaporation materials is heated to form a layer containing different evaporation materials is formed on the first electrode provided for the second substrate; and a second electrode is formed on the layer containing different evaporation materials.

12 Claims, 13 Drawing Sheets

(56) References Cited

U.S. PATENT DOCUMENTS

| | | |
|---|---|---|
| 2001/0036561 A1 | 11/2001 | Wolk et al. |
| 2001/0046611 A1* | 11/2001 | Kido et al. .................... 428/690 |
| 2002/0025391 A1* | 2/2002 | Angelopoulos et al. ....... 428/1.4 |
| 2003/0045021 A1* | 3/2003 | Akai ............................... 438/99 |
| 2003/0072890 A1 | 4/2003 | Miyazawa |
| 2003/0148021 A1* | 8/2003 | Ishizuka ......................... 427/66 |
| 2003/0168970 A1* | 9/2003 | Tominaga et al. ............ 313/504 |
| 2004/0029039 A1* | 2/2004 | Tutt et al. .................. 430/270.11 |
| 2004/0031442 A1 | 2/2004 | Yamazaki et al. |
| 2004/0209119 A1 | 10/2004 | Seo et al. |
| 2006/0099344 A1* | 5/2006 | Boroson et al. ............ 427/255.6 |
| 2006/0141136 A1 | 6/2006 | Miyazawa |
| 2008/0268561 A1 | 10/2008 | Ikeda et al. |

FOREIGN PATENT DOCUMENTS

| | | |
|---|---|---|
| EP | 1 426 189 A2 | 6/2004 |
| EP | 1 657 074 A1 | 5/2009 |
| JP | 2000-77182 | 3/2000 |
| JP | 2002-534782 | 10/2002 |
| JP | 2003-187974 | 7/2003 |
| JP | 2003-308974 | 10/2003 |
| JP | 2004-43965 | 2/2004 |
| JP | 2004-71550 | 3/2004 |
| JP | 2004-288439 | 10/2004 |
| JP | 2006-309955 | 11/2006 |
| JP | 2008-293961 | 12/2008 |
| WO | WO 00/41892 A1 | 7/2000 |
| WO | WO 00/41893 A1 | 7/2000 |

* cited by examiner

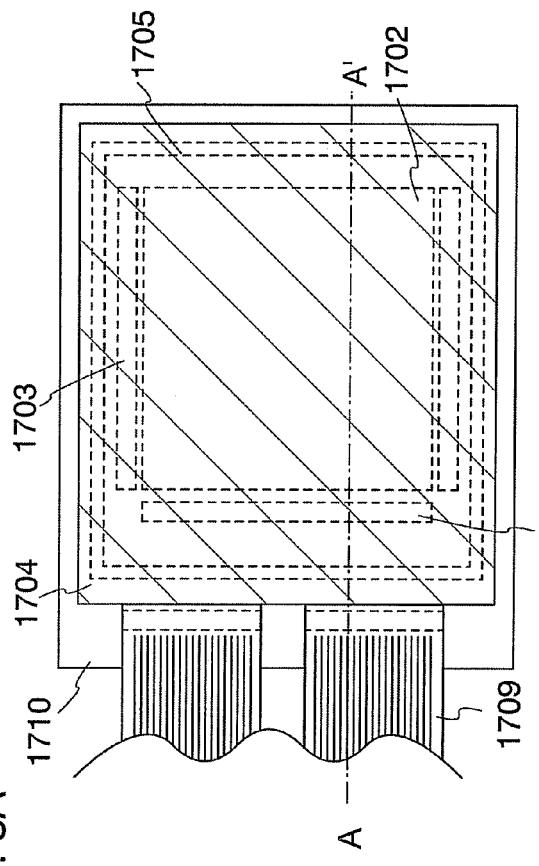
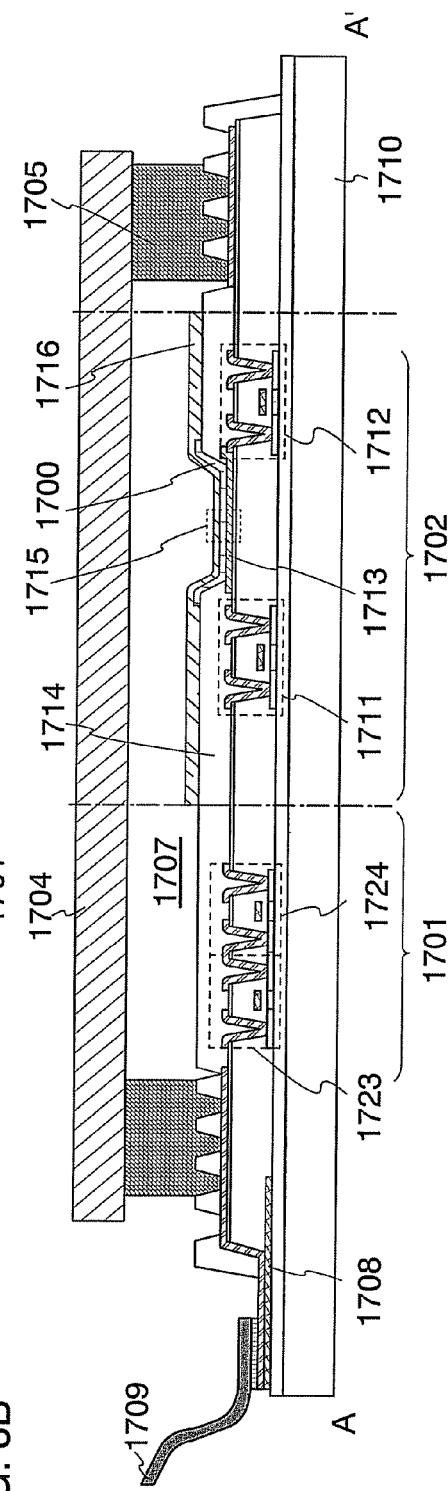
FIG. 8A
FIG. 8B

METHOD FOR MANUFACTURING LIGHT-EMITTING DEVICE

BACKGROUND OF THE INVENTION

1. Field of the Invention

The present invention relates to a light-emitting device and a method for manufacturing the light-emitting device.

2. Description of the Related Art

An organic compound can have various structures in comparison with an inorganic compound, and it is possible to synthesize materials having various functions by appropriate molecular design. Because of these advantages, photo electronics and electronics using a functional organic material have been attracting attention in recent years.

As examples of electronic devices using organic compounds as functional organic materials, there are solar cells, light-emitting elements, organic transistors, and the like. These devices take advantage of electric properties and optical properties of the organic compound. Among them, in particular, light-emitting elements have been making remarkable progress.

It is said that, as for a light-emitting mechanism of a light-emitting element, an EL layer is sandwiched between a pair of electrodes and voltage is applied to the EL layer, and thus electrons injected from a cathode and holes injected from an anode are recombined in an emission center of the EL layer to form molecular excitons, and the molecular excitons release energy when returning to a ground state; thus, light is emitted. Singlet excitation and triplet excitation are known as excited states, and it is thought that light emission can be obtained through either of these excited states.

An EL layer included in a light-emitting element includes at least a light-emitting layer. In addition, the EL layer can have a stacked-layer structure including a hole injecting layer, a hole transporting layer, an electron transporting layer, an electron injecting layer, and/or the like, in addition to the light-emitting layer.

Although a light-emitting layer can be formed of only a light-emitting material, it is known that the light-emitting layer is formed of a combination of a host material and a dopant material so that desired characteristics of emission wavelength, emission efficiency, and the like are obtained. For example, the present applicant discloses a light-emitting element containing a host material and a dopant material in Patent Document 1 (Japanese Published Patent Application No. 2004-288439).

In addition, an EL material for forming an EL layer is broadly classified into a low molecular (monomer) material and a high molecular (polymer) material. A low molecular material is generally deposited using an evaporation apparatus. A conventional evaporation apparatus, in which a substrate is set on a substrate holder, includes a crucible (or an evaporation boat) in which an EL material, that is, an evaporation material is contained; a shutter for preventing the EL material to be sublimated from rising; and a heater for heating the EL material in the crucible. Then, the EL material heated by the heater is sublimated, whereby the EL material is deposited on the substrate. For example, the present applicant discloses an evaporation apparatus which is capable of moving an evaporation source relative to a substrate in Patent Document 2 (Japanese Published Patent Application No. 2004-043965).

In the case where an organic compound layer containing a host material and a dopant material is formed using a conventional evaporation apparatus, a method is known in which a host material is put in a plurality of crucibles and a dopant material is put in a plurality of crucibles and they are co-deposited. In the case where a light-emitting layer is formed, a very small amount of dopant material is added to the host material. Therefore, the evaporation rate of the dopant material needs to be controlled so as to be much smaller than the evaporation rate of the host material, and precise control of the evaporation rate is needed.

However, in the case where evaporation is performed using a crucible, a temperature distribution in the crucible tends to be non-uniform and it is difficult to maintain a constant evaporation rate. In particular, in the case where different kinds of materials such as a host material and a dopant material are co-deposited, it is very difficult to precisely control the evaporation rate of each of the host material and the dopant material.

SUMMARY OF THE INVENTION

In view of the foregoing problems, it is an object of the present invention to provide a formation method which is capable of easily forming a desired layer containing different evaporation materials by use of a plurality of evaporation materials. In addition, it is another object to provide a formation method which is capable of precisely forming a layer in which a plurality of materials is contained. Moreover, it is another object to provide a manufacturing method of a light-emitting device including the layer containing different evaporation materials, which is formed by the above-described method.

A plurality of layers each containing a different evaporation material from each other is stacked over a first substrate. A second substrate which has a first electrode is placed at a position facing the first substrate. The plurality of layers containing evaporation materials over the first substrate is heated to form a layer containing different evaporation materials is formed on the first electrode provided for the second substrate. A second electrode is formed on the layer containing different materials to manufacture a light-emitting device.

In the above-described structure, the plurality of layers containing evaporation materials is desirably stacked so that an evaporation material whose evaporation temperature is low is contained on the first substrate side. Such a structure makes it possible to efficiently sublimate and evaporate the plurality of layers containing evaporation materials. Note that the "evaporation temperature" in this specification refers to a temperature at which a material is sublimated.

Alternatively, in the plurality of layers containing the evaporation materials, two layers each containing an evaporation material may be stacked alternately in such a manner that a layer containing a first evaporation material, a layer containing a second evaporation material, a layer containing a first evaporation material, and a layer containing a second evaporation material are stacked. The layers are alternately stacked, whereby the first evaporation material and the second evaporation material can be mixed more uniformly. In addition, the mixture ratio of the evaporation materials contained in a layer deposited on a substrate on which a film is to be deposited (hereinafter, such a substrate is referred to as a deposition substrate) can be controlled by control of the thickness of each layer.

In addition, in the above-described structure, although the plurality of layers containing evaporation materials can be formed by various methods, at least one of the plurality of layers containing evaporation materials is preferably formed by a wet process. Since efficiency in the use of materials of a wet process is high, the use of a wet process makes it possible to reduce manufacturing cost of a light-emitting device.

One aspect of the present invention disclosed in this specification is a method for manufacturing a light-emitting device, which includes the steps of stacking a plurality of layers each containing a different evaporation material from each other over a first substrate; placing a second substrate which has a first electrode at a position facing the first substrate; heating the plurality of layers containing evaporation materials over the first substrate to form a layer containing different evaporation materials on the first electrode provided for the second substrate; and forming a second electrode on the layer containing different evaporation materials.

Another aspect of the present invention disclosed in this specification is a method for manufacturing a light-emitting device, which includes the steps of stacking a plurality of layers each containing a different evaporation material from each other over a first substrate; placing a second substrate at a position facing the first substrate; heating the plurality of layers containing evaporation materials over the first substrate to form a layer containing different evaporation materials on the second substrate; forming a light-emitting layer on the layer containing different evaporation materials; and forming a second electrode on the light-emitting layer.

Another aspect of the present invention disclosed in this specification is a method for manufacturing a light-emitting device, which includes the steps of stacking a plurality of layers each containing a different evaporation material from each other over a first substrate; placing a second substrate provided with a light-emitting layer formed over a first electrode at a position facing the first substrate; and heating the plurality of layers containing evaporation materials over the first substrate to form a layer containing different evaporation materials on the light-emitting layer provided for the second substrate.

Another aspect of the present invention disclosed in this specification is a method for manufacturing a light-emitting device, which includes the steps of forming a first layer containing a first evaporation material over a first substrate; forming a second layer containing a second evaporation material over the first layer; placing a second substrate which has a first electrode at a position facing the first substrate; the first layer and the second layer over the first substrate is heated to form a layer containing the first evaporation material and the second evaporation material on the first electrode provided for the second substrate; and forming a second electrode on the layer containing the first evaporation material and the second evaporation material.

Another aspect of the present invention disclosed in this specification is a method for manufacturing a light-emitting device, which includes the steps of forming a first layer containing a first evaporation material over a first substrate; forming a second layer containing a second evaporation material over the first layer; forming a third layer containing a first evaporation material over the second layer; placing a second substrate which has a first electrode at a position facing the first substrate; the first layer, the second layer, and the third layer over the first substrate are heated to form a layer containing the first evaporation material and the second evaporation material on the first electrode provided for the second substrate; and forming a second electrode on the layer containing the first evaporation material and the second evaporation material.

Another aspect of the present invention disclosed in this specification is a method for manufacturing a light-emitting device, which includes the steps of alternately stacking a layer containing a first evaporation material and a layer containing a second evaporation material; placing a second substrate which has a first electrode at a position facing the first substrate; heating the layer containing the first evaporation material and the layer containing the second evaporation material over the first substrate to form a layer containing the first evaporation material and the second evaporation material on the first electrode provided for the second substrate; and forming a second electrode on the layer containing the first evaporation material and the second evaporation material.

Another aspect of the present invention disclosed in this specification is a method for manufacturing a light-emitting device, which includes the steps of forming a first layer containing a first evaporation material over a first substrate; forming a second layer containing a second evaporation material over the first layer; forming a third layer containing a third evaporation material over the second layer; placing a second substrate which has a first electrode at a position facing the first substrate; heating the first layer, the second layer, and the third layer over the first substrate to form a layer containing the first evaporation material, the second evaporation material, and the third evaporation material on the first electrode provided for the second substrate; and forming a second electrode on the layer containing the first evaporation material, the second evaporation material, and the third evaporation material.

In the above-described structure, the evaporation temperature of the first evaporation material is desirably lower than the evaporation temperature of the second evaporation material. Note that the "evaporation temperature" in this specification refers to a temperature at which a material is sublimated.

In addition, in the above-described structure, it is desirable that the first evaporation material be an organic substance and the second evaporation material be an inorganic substance. This structure makes it possible to deposit a layer containing an organic substance and an inorganic substance at high efficiency in the use of materials.

Note that, in this specification, the distance between a surface of a plurality of layers containing evaporation materials, which is formed over a first substrate and serves as an evaporation source, and a surface of a second substrate is defined as distance d. In addition, in the case where a certain layer (e.g., a conductive layer which functions as an electrode or an insulating layer which functions as a partition wall) is formed on the second substrate, the distance d is defined as the distance between the surface of the layer formed over the first substrate and the surface of the layer formed on the second substrate. Note that, in the case where the second substrate or the layer formed on the second substrate is uneven, the distance d is defined as the shortest distance between the surface of the layer formed over the first substrate and the outermost surface of the second substrate or the layer formed on the second substrate.

The present invention makes it possible to easily form a layer containing a plurality of materials, the evaporation temperatures of which are different. In addition, a desired layer containing a plurality of different materials can be obtained accurately without the necessity of complicated control. Moreover, a light-emitting device including the obtained layer containing a plurality of different materials can be provided.

BRIEF DESCRIPTION OF THE DRAWINGS

In the accompanying drawings:

FIG. 8A is a top view of an example of an active matrix light-emitting device and FIG. 8B is a cross-sectional view of the same;

DETAILED DESCRIPTION OF THE INVENTION

Figure 1A:
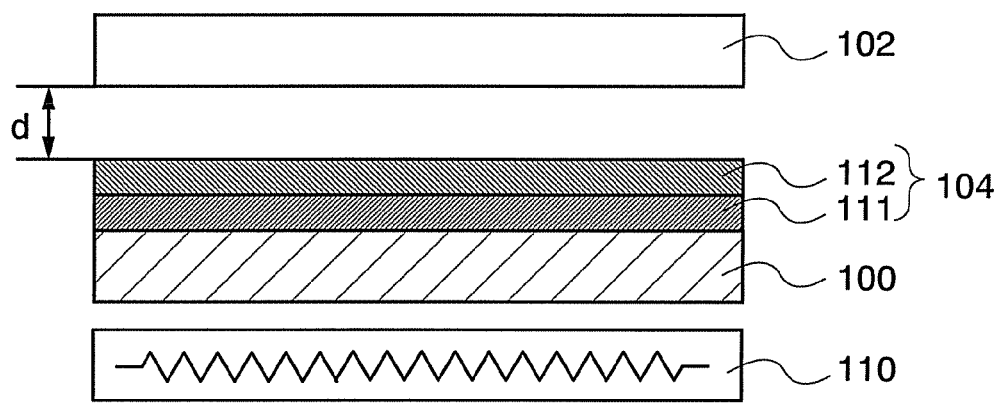
FIGS. 1A and 1B are schematic views showing cross sections of films formed through a process of the present invention.

Embodiment Modes of the present invention will be hereinafter described with reference to the accompanying drawings. Note that the present invention is not limited to the description below and it is easily understood by those skilled in the art that modes and details of the present invention can be modified in various ways without departing from the purpose and scope of the present invention. Therefore, the present invention should not be interpreted as being limited to the description of Embodiment Modes below. Note that, in the structures of the present invention described below, reference numerals denoting the same components may be used in common in different drawings.

[Embodiment Mode 1]

A method for manufatcuring a light-emitting device of the present invention will be described with reference to FIGS. 1A and 1B.

Figure 1B:
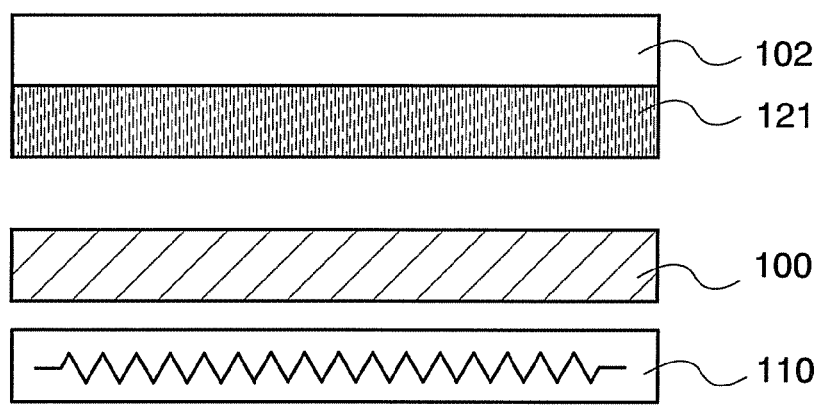

In FIGS. 1A and 1B, a plurality of layers 104 containing evaporation materials is stacked over a first substrate 100. These layers serve as an evaporation source of the present invention. In the evaporation source of the present invention, the plurality of layers containing evaporation materials is stacked, and thus, contrary to a co-evaporation method, the evaporation source is a single unit even though it contains a plurality of evaporation materials.

The first substrate 100 is a substrate for forming the plurality of layers containing evaporation materials which serves as an evaporation source. The substrate 100 serves as a supporting substrate of the plurality of layers containing evaporation materials. As the first substrate 100, for example, the following can be used: an oxide substrate made of quartz, ceramic, sapphire, or the like, or a conductive substrate made of a metal material such as gold, platinum, copper, silver, tungsten, tantalum, titanium, or aluminum, or an alloy material of the metal. Alternatively, a substrate in which the above-described metal material or the above-described alloy material is formed over the oxide substrate, or the like can be used. Further alternatively, a conductive substrate over which a semiconductor material such as silicon or germanium is formed can be used. Still alternatively, a substrate in which an amorphous silicon film or a microcrystalline silicon film is formed over a light-transmitting substrate (e.g., a glass substrate, a quartz substrate, or a plastic substrate containing an inorganic material) may be used. Note that, when lamp light or laser light is used as a means to heat the first substrate 100, the first substrate 100 is desirably formed using a material which absorbs the light. For example, when a halogen lamp is used as a means to heat the first substrate 100, titanium which absorbs light from the halogen lamp is desirably used for the first substrate 100.

In the evaporation source of the present invention, the plurality of layers containing evaporation materials is stacked over the first substrate 100. FIG. 1A shows a structure in which two layers containing evaporation materials are stacked as the evaporation source. Note that the number of layers containing evaporation materials is not limited to two, and three or more layers may be stacked. Alternatively, a stacked layer in which a layer containing a first evaporation material, a layer containing a second evaporation material, and a layer containing a first evaporation material are alternately stacked may be used. The layers are alternately stacked, whereby the first evaporation material and the second evaporation material can be uniformly mixed. That is, layers are alternately stacked, whereby a layer in which evaporation materials are uniformly mixed can be obtained. Control of the thicknesses or the like of layers containing evaporation materials makes it possible to control the mixture ratio of the materials in a layer deposited on a substrate over which a film is to be deposited (hereinafter, the substrate is referred to as a deposition substrate).

Note that the plurality of layers containing evaporation materials is desirably stacked so that an evaporation material whose evaporation temperature is low is contained on the first substrate 100 side. Such a structure makes it possible to efficiently sublimate and evaporate the plurality of layers containing evaporation materials. Note that the "evaporation temperature" in this specification refers to a temperature at which a material is sublimated.

For example, FIG. 1A shows the case where a layer 112 containing a second evaporation material is stacked over a layer 111 containing a first evaporation material. The first evaporation material and the second evaporation material are different from each other. The evaporation temperature of the first evaporation material provided on the first substrate 100 side is desirably lower than that of the second evaporation material.

The plurality of layers containing evaporation materials is formed by various methods. For example, a dry process such as a vacuum evaporation method or a sputtering method can be used. Alternatively, a wet process such as a spin coating method, an ink-jet method, a dip coating method, a cast method, a dye coating method, a roll coating method, a blade coating method, a bar coating method, a gravure coating method, or a printing method can be used. In order to form an evaporation source by such a wet process, a desired evaporation material is dissolved or dispersed in a solvent and a solution or a dispersion solution is controlled. There is no particular limitation on the solution as long as it can dissolve or disperse an evaporation material and it does not react with the evaporation material. For example, as a solvent, any of the following can be used: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, or xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like.

In addition, when layers containing evaporation materials are stacked by a wet process, the layers are stacked with use of a solvent in which a layer which has been formed is not dissolved easily. The use of a wet process makes it possible to increase efficiency in the use of materials and reduce manufacturing cost of a light-emitting device.

Note that, as an evaporation material, various materials can be used regardless of an organic substance or an inorganic substance. For example, as an organic substance for the evaporation material, there are a light-emitting material, a carrier transporting material, and the like used for a light-emitting device. In addition, as an inorganic substance for the evaporation material, there are metal oxide, metal nitride, metal halide, simple metal used for a carrier transporting layer, a carrier injecting layer, an electrode or the like of a light-emitting device; and the like.

In addition, the manufacturing method of the present invention is useful especially in the case where a layer containing a plurality of evaporation materials which are not dissolved or dispersed in the same solvent is formed. That is, when a plurality of evaporation materials are not mixed with or dispersed in the same solvent, it is difficult to directly form a mixed layer by a wet process. However, the manufacturing method of the present invention makes it easy to form a layer containing such a plurality of evaporation materials.

Next, the first substrate 100 is carried in a deposition chamber. Then, a second substrate 102 which faces a surface of the substrate 100 provided with the plurality of layers containing evaporation materials is placed. The second substrate 102 is a deposition substrate on which a desired layer is deposited through an evaporation process. Then, the first substrate 100 and the second substrate 102 in the deposition chamber are brought close to each other so as to face at close range therebetween, specifically, they are brought close to each other so that the distance d between the surface of the plurality of layers containing evaporation materials provided for the first substrate 100 and the second substrate 102 becomes greater than or equal to 0 mm and less than or equal to 50 mm, preferably greater than or equal to 0 mm and less than or equal to 10 mm (see FIG. 1A). Further preferably, the first substrate 100 and the second substrate 102 are brought close to face each other so that the distance therebetween is greater than or equal to 0 mm and less than or equal to 1 mm. The first substrate 100 and the second substrate 102 are placed at close range in this manner, whereby efficiency in the use of materials in deposition can be increased.

The distance d is defined as the distance between the surface of the plurality of layers 104 containing evaporation materials over the first substrate 100 and the surface of the second substrate 102. In addition, in the case where a certain layer (e.g., a conductive layer which functions as an electrode or an insulating layer which functions as a partition wall) is formed on the second substrate 102, the distance d is defined as the distance between the surface of the plurality of layers 104 containing evaporation materials over the first substrate 100 and the surface of the layer formed on the second substrate 102. Note that, in the case where the surface of the second substrate 102 or the layer formed on the second substrate 102 is uneven, the distance d is defined as the shortest distance between the surface of the plurality of layers 104 containing evaporation materials over the first substrate 100 and the outermost surface of the second substrate 102 or the layer formed on the second substrate 102.

Although, in this embodiment mode, it is desirable that the distance between the first substrate 100 and the second substrate 102 be short in order to increase the efficiency in the use of materials, the present invention is not limited to this structure. If the efficiency in the use of materials is not considered, the distance d between the first substrate 100 and the second substrate 102 may be greater than 50 mm.

In addition, in the case where the second substrate 102 is flat without formation of a certain layer thereover, it is desirable that the surface of the plurality of layers 104 containing evaporation materials over the first substrate 100 and a surface on which a film is to be deposited (hereinafter, such a surface is referred to as a deposition surface) of the second substrate 102 be not in contact with each other. That is, the distance d therebetween is desirably longer than 0 mm.

The deposition chamber is desirably vacuum-evacuated. Specifically, the deposition chamber is vacuum-evacuated to less than or equal to $5\times10^{-3}$ Pa, preferably the range from about $10^{-4}$ to about $10^{-6}$ Pa. As a vacuum evacuation unit connected to the deposition chamber, an oil-free dry pump is used when vacuum evacuation of from the atmospheric pressure to a pressure on the order of 1 Pa is performed, whereas a magnetic floating turbo molecular pump or a compound molecular pump is used when vacuum evacuation of a pressure lower than the above-described range is performed. A cryo-pump may also be provided in the deposition chamber in order to remove moisture. This prevents contamination by an organic substance from the evacuation unit, such as mainly oil. Mirror treatment is performed on an inner wall surface by electrolytic polishing to reduce the surface area, and accordingly gas is prevented from being discharged.

In addition, a heating unit is provided in the deposition chamber. The first substrate 100 is placed near the heating unit. FIGS. 1A and 1B each show an example in which a heater 110 is provided as the heating unit. Note that there is no particular limitation on the type of heating unit as long as the heating unit can perform uniform heating in a short time. For example, a lamp may be used, or a resistance heating method may be used. In addition, a conductive substrate may be used as the first substrate 100 and current may be passed through the conductive substrate, whereby heating can be performed. In this case, the first substrate 100 is a supporting substrate and also has a function as a heating unit.

Next, the plurality of layers 104 containing evaporation materials provided over the first substrate 100 is heated to be vaporized, whereby a layer 121 containing different evaporation materials is deposited on the deposition surface (a lower surface in FIGS. 1A and 1B) of the second substrate 102 placed facing the first substrate 100 (see FIG. 1B).

Through the above-described steps, the layer 121 containing different evaporation materials can be formed on one surface of the second substrate 102, specifically a surface of the second substrate 102, which faces the first substrate 100. Note that the thickness of the layer 121 containing different evaporation materials which is to be deposited depends on the thickness of the plurality of layers 104 containing evaporation materials which serves as the evaporation source. At this time, depending on materials for forming the plurality of layers 104 containing evaporation materials, the thickness of the layer 121 containing different evaporation materials and the thickness of the plurality of layers 104 containing evaporation materials can be approximately the same. In other words, the thickness of the layer which is to be formed through an evaporation process can be controlled by control of the thickness of the evaporation source.

In addition, depending on heat treatment conditions, the concentration distribution of each material in the layer deposited on the deposition substrate can be controlled. For example, when heating is performed slowly with low temperature rise rate, the concentration of each material in the deposited layer is not uniform and has a concentration gradient. In addition, when heating is performed rapidly with high temperature rise rate, the concentration of each material in the deposited layer becomes almost uniform. As described above, the concentration distribution of each material in the layer deposited on the deposition substrate can be controlled as appropriate in accordance with required characteristics. Moreover, the deposition method described in this embodiment mode is repeated, whereby the concentration of each material in the deposited layer can be more uniform. Specifically, a layer deposited over a first deposition substrate may be used as an evaporation source to deposit a film on a second deposition substrate. This process is repeated, whereby a mixed layer which has more uniform concentration distribution can be formed.

In this embodiment mode, a film is used which is obtained in such a manner that the plurality of layers containing evaporation materials which serves as an evaporation source is deposited over a substrate by a dry process or a wet process. In particular, it is preferable to form the evaporation source by a wet process. When an evaporation source is formed by a wet process, the area of the evaporation source can be increased. That is, an evaporation source which has about the same area as a deposition substrate can be easily formed. This makes it possible to heat the whole evaporation source more uniformly in a shorter time than in the case where a conventional crucible or a conventional deposition boat is used. Thus, the layer containing evaporation materials can be precisely evaporated on the second substrate which is a deposition substrate. Furthermore, the distance d between the first substrate over which the evaporation source is formed and the second substrate which is a deposition substrate is shortened, whereby the evaporation materials can be prevented from being dispersed in portions other than the second substrate (e.g., the inner wall of the deposition chamber, or the like). Thus, the layer containing different evaporation materials can be deposited on the deposition substrate without waste of the evaporation materials.

In the plurality of layers containing evaporation materials, layers containing evaporation materials, the evaporation temperatures of which are different from each other are stacked. In addition, the plurality of layers is desirably stacked so that an evaporation material whose evaporation temperature is low is contained on the first substrate 100 side. This structure makes it possible to efficiently sublimate and evaporate the plurality of layers containing evaporation materials. For example, in the case where the evaporation temperatures of the plurality of evaporation materials formed over the first substrate 100 are close to each other, when the evaporation material whose evaporation temperature is low, which is provided on the first substrate 100 side, is heated at the evaporation temperature thereof, the layer containing evaporation material which is stacked over the layer on the first substrate 100 side as well as the layer containing evaporation material on the first substrate 100 side can be evaporated.

The plurality of layers containing evaporation materials is heated using the heating unit provided in the deposition chamber. For example, when the heater 110 is provided as shown in FIGS. 1A and 1B, the heater 110 may be kept away from the first substrate 100 before the heating (deposition) and the heater 110 may be brought close to the first substrate 100 at the time of the heating. Alternatively, a switch which works with the heater 110 may be provided so that the heating and heat insulation may be controlled by turning on and off of the switch. When a lamp is used as the heating unit, heating and heat insulation can be controlled by lighting and extinction of the lamp. Further alternatively, an openable and closable shutter may be provided between the heating unit and the first substrate 100 so that heating and heat insulation are controlled.

In addition, when a lamp is used as the heating unit, part of the inner wall of the deposition chamber may be made of a light-transmitting member and the lamp may be provided outside the deposition chamber. The lamp is placed outside the deposition chamber, whereby maintenance such as replacement of light bulbs of the lamp can be easier.

Figure 2A:
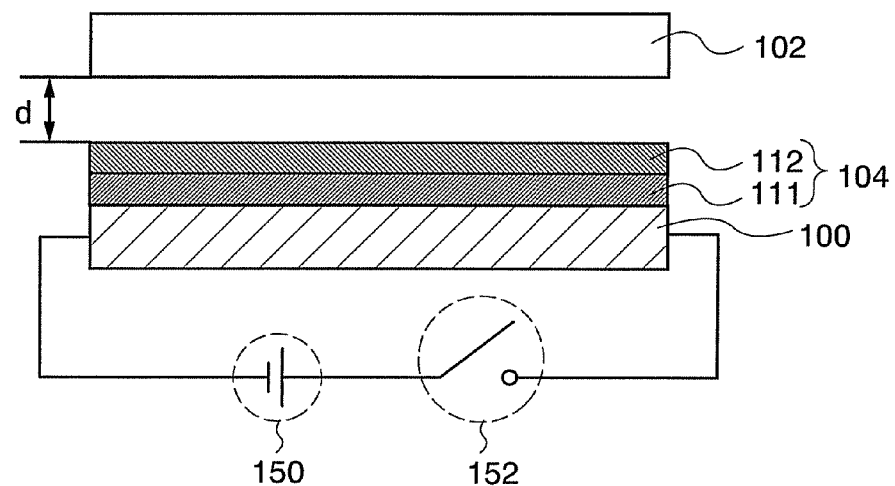
FIGS. 2A and 2B are schematic views showing cross sections of films formed through a process of the present invention.
Figure 2B:
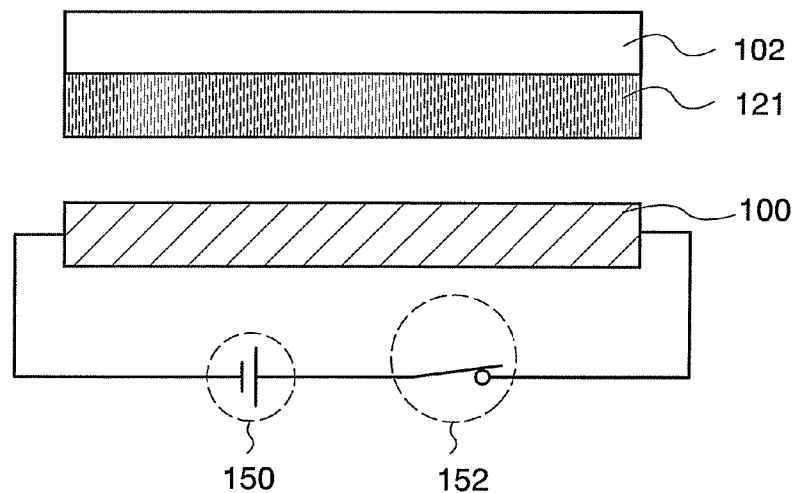

Alternatively, the plurality of layers containing evaporation materials can be heated in such a manner that a conductive substrate is used as the first substrate 100 and current is passed through the conductive substrate. For example, as shown in FIG. 2A, a power supply 150 and a switch 152 which are electrically connected to the first substrate 100 which is a conductive substrate are provided. When the switch 152 is turned on as shown in FIG. 2B, current is passed through the first substrate 100, whereby heating can be performed. The plurality of layers containing evaporation materials is heated to be vaporized by current passed through the first substrate 100, whereby the layer 121 containing different evaporation materials can be formed on the second substrate 102. Note that, in this case, the first substrate 100 functions as part of a heating unit.

Note that, although FIGS. 1A and 1B each show an example in which the size of the first substrate 100 and the size of the second substrate 102 are the same, there are no particular limitations on the sizes of the first substrate 100 and the second substrate 102, and the size of one of the substrates may be larger than that of the other.

In addition, in the case where deposition is selectively performed on the deposition substrate, a mask including an opening may be placed between the first substrate 100 and the second substrate 102.

In the deposition method of the present invention which is applied to the light-emitting device, the plurality of layers containing evaporation materials whose evaporation temperatures are different from each other is used as the evaporation source. The evaporation materials contained in the evaporation source can be evaporated uniformly. Thus, the layer containing different evaporation materials, which contains the same evaporation material as the evaporation source at approximately the same weight ratio can be deposited on the deposition substrate. That is, the weight ratio of the evaporation materials contained in the layer containing different evaporation materials, which is deposited on the deposition substrate can be controlled by control of the thicknesses of the plurality of layers containing evaporation materials. As described above, in the deposition method of the present invention, in the case where deposition is performed using the plurality of evaporation materials whose evaporation temperatures are different from each other, the evaporation rate of each evaporation material does not need to be controlled, unlike the case of co-evaporation. Thus, complicated control of the evaporation rate or the like does not need to be performed, and the desired layer containing different evaporation materials can be deposited easily and precisely.

In addition, in the deposition method of the present invention which is applied to the light-emitting device, the thickness of the layer containing different evaporation materials which is to be deposited on the deposition substrate through an evaporation process can be controlled by control of the thickness of the evaporation source formed over the supporting substrate. In other words, the evaporation source formed over the supporting substrate may be evaporated as it is; thus, a film-thickness monitor is not needed. Therefore, a user does not have to adjust the evaporation speed with use of a film-thickness monitor, and the deposition process can be fully automated. Accordingly, throughput can be increased.

Moreover, the deposition method of the present invention makes it possible to deposit desired evaporation materials on the deposition substrate without waste of the desired evaporation materials. Thus, efficiency in the use of evaporation materials is increased, and reduction in cost can be achieved. In addition, the evaporation materials can be prevented from being attached to the inner wall of the deposition chamber, and maintenance of the deposition apparatus can be easier.

Accordingly, application of the present invention makes it possible to easily deposit a desired layer containing different evaporation materials and to increase throughput in manufacture of a light-emitting device using the layer containing different evaporation materials, or the like.

Note that this embodiment mode can be combined with other embodiment modes described in this specification as appropriate.

[Embodiment Mode 2]

In this embodiment mode, a manufacturing method of a light-emitting device, to which the present invention is applied, will be described.

Figure 3A:
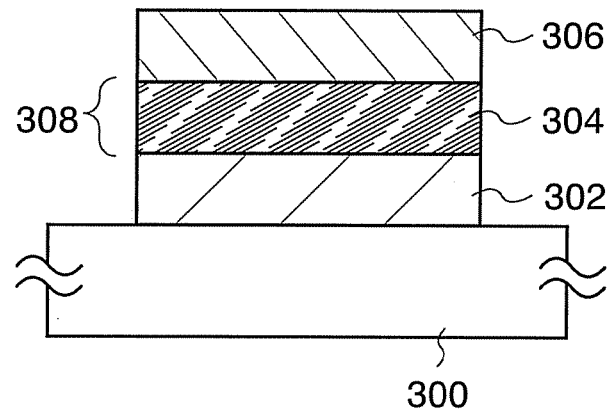
FIGS. 3A and 3B are views each showing an example of a light-emitting element.
Figure 3B:
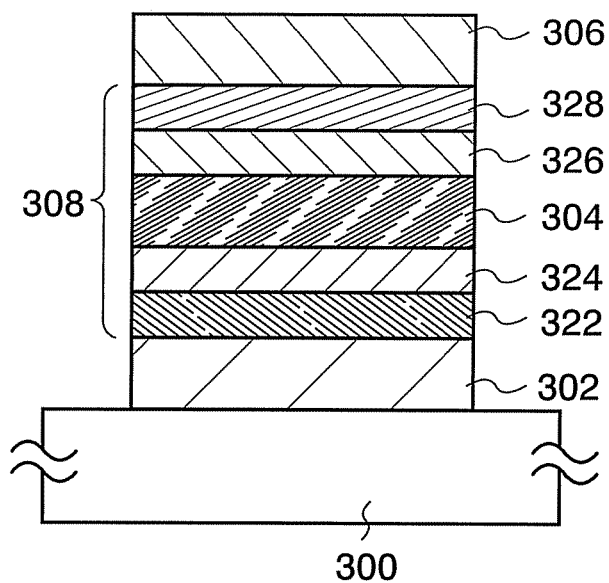

For example, light-emitting elements shown in FIGS. 3A and 3B can be manufactured. In the light-emitting element shown in FIG. 3A, a first electrode layer 302, an EL layer 308 which functions as a light-emitting layer 304, and a second electrode layer 306 are stacked in this order over a substrate 300. One of the first electrode layer 302 and the second electrode layer 306 functions as an anode, and the other functions as a cathode. Holes injected from the anode and electrons injected from the cathode are recombined in the light-emitting layer 304, whereby light emission can be obtained. In this embodiment mode, the light-emitting layer 304 is formed of a mixed layer in which a very small amount of dopant material which is a light-emitting material is dispersed in a host material. In addition, the first electrode layer 302 functions as an anode and the second electrode layer 306 functions as a cathode.

In the light-emitting element shown in FIG. 3B, a hole injecting layer, a hole transporting layer, an electron transporting layer, and an electron injecting layer are provided, in addition to the components in the above-described structure shown in FIG. 3A, are provided. The hole transporting layer is provided between the anode and the light-emitting layer. In addition, the hole injecting layer is provided between the anode and the light-emitting layer, or between the anode and the hole transporting layer. On the other hand, the electron transporting layer is provided between the cathode and the light-emitting layer, and the electron injecting layer is provided between the cathode and the light-emitting layer, or between the cathode and the electron transporting layer. Note that all of the hole injecting layer, the hole transporting layer, the electron transporting layer, and the electron injecting layer are not necessarily provided, and the layer which is to be provided may be selected as appropriate in accordance with the required function or the like. In FIG. 3B, the first electrode layer 302 which functions as an anode, a hole injecting layer 322, a hole transporting layer 324, the light-emitting layer 304, an electron transporting layer 326, an electron injecting layer 328, and the second electrode layer 306 which functions as a cathode are stacked in this order over the substrate 300.

As the substrate 300, a substrate with an insulating surface or an insulating substrate is used. Specifically, any of a variety of glass substrates made of glass used for the electronics industry, such as aluminosilicate glass, aluminoborosilicate glass, or barium borosilicate glass; a quartz substrate; a ceramic substrate; a sapphire substrate; or the like can be used.

As the first electrode layer 302 and the second electrode layer 306, various types of metal, alloys, electrically conductive compounds, mixtures of these can be used. For example, indium tin oxide (ITO), indium tin oxide containing silicon or silicon oxide, indium zinc oxide (IZO), indium oxide containing tungsten oxide or zinc oxide (IWZO), and the like can be given. Although films including such conductive metal oxide are generally formed by sputtering, a sol-gel method or the like may also be applied. For example, indium zinc oxide (IZO) can be formed by a sputtering method using a target in which zinc oxide of 1 to 20 wt % is added to indium oxide. Indium oxide containing tungsten oxide and zinc oxide (IWZO) can be formed by a sputtering method using a target in which 0.5 to 5 wt % of tungsten oxide and 0.1 to 1 wt % of zinc oxide are contained in indium oxide. Besides, gold (Au), platinum (Pt), nickel (Ni), tungsten (W), chromium (Cr), molybdenum (Mo), iron (Fe), cobalt (Co), copper (Cu), palladium (Pd), nitride of a metal material (e.g., titanium nitride), and the like can be given. Alternatively, aluminum (Al), silver (Ag), an alloy containing aluminum (AlSi), or the like can be used. Alternatively, any of the following materials with a low work function can be used: elements which belong to Group 1 and Group 2 of the periodic table, that is, alkali metal such as lithium (Li) and cesium (Cs) and alkaline-earth metal such as magnesium (Mg), calcium (Ca), and strontium (Sr), and alloys thereof (an alloy of aluminum, magnesium, and silver, or an alloy of aluminum and lithium); rare earth metal such as europium (Eu) and ytterbium (Yb), and alloys thereof; and the like. A film made of an alkali metal, an alkaline earth metal, or an alloy of them can be formed by a vacuum evaporation method. Alternatively, a film made of an alloy of alkali metal or alkaline earth metal can be formed by a sputtering method. It is also possible to deposit a silver paste or the like by an ink-jet method or the like. The first electrode 302 and the second electrode 306 can be formed as a stacked-layer film without being limited to a single-layer film.

Note that since light emitted from the light-emitting layer 304 is extracted outside, one or both of the first electrode layer 302 and the second electrode layer 306 is/are formed so as to transmit light. For example, the first electrode layer 302 or the second electrode layer 306 is formed using a conductive material having a light-transmitting property, such as indium tin oxide, or silver, aluminum, or the like is formed to a thickness of several nm to several tens nm. Alternatively, the first electrode layer 302 or the second electrode layer 306 can have a stacked-layer structure including a thin film of a metal such as silver or aluminum and a thin film of a conductive material having a light-transmitting property, such as ITO. Note that the first electrode layer 302 or the second electrode layer 306 may be formed by various methods.

The light-emitting layer 304, the hole injecting layer 322, the hole transporting layer 324, the electron transporting layer 326, or the electron injecting layer 328 can be formed by application of the deposition method described in above Embodiment Mode 1. In addition, the electrode layer can also be formed by application of the deposition method described in above Embodiment Mode 1.

For example, when the light-emitting element shown in FIG. 3A is formed, a plurality of layers containing evaporation materials, which serves as an evaporation source for forming a light-emitting layer, is formed over a supporting substrate, and the supporting substrate is placed so as to face a deposition substrate. The plurality of layers containing evaporation materials formed over the supporting substrate is heated to be vaporized, whereby the light-emitting layer 304 is formed on the deposition substrate. Then, the second electrode layer 306 is formed over the light-emitting layer 304. Here, the deposition substrate is the substrate 300. Note that the first electrode layer 302 is formed in advance on the deposition substrate. The plurality of layers containing evaporation materials is a stacked layer of a layer containing a substance (a host material) which disperses a light-emitting material and a layer containing a light-emitting material (a dopant material). The light-emitting layer is formed with use of the evaporation source which has such a structure, whereby the light-emitting layer 304 has a structure in which a substance (a host material) which disperses a light-emitting material and a light-emitting material (a dopant material) are contained and the light-emitting material (the dopant material) is dispersed in the substance (the host material) which disperses a light-emitting material.

The structure in which a substance with a high light-emitting property (a dopant material) is dispersed in another substance (a host material) is used for the light-emitting layer, whereby crystallization of the light-emitting layer can be controlled. In addition, concentration quenching which results from high concentration of a substance with a high light-emitting property can be also suppressed. Note that two or more kinds of host materials and a dopant material may be used, or two or more kinds of dopant materials and a host material may be used. Alternatively, two or more kinds of host materials and two or more kinds of dopant materials may be used.

As a host material used for the light-emitting layer, the following can be given: 4,4'-di(N-carbazolyl)biphenyl (CBP), 2-tert-butyl-9,10-di(2-naphthyl)anthracene (t-BuDNA), 9-[4-(9-carbazolyl)phenyl]-10-phenylanthracene (CzPA), and the like in addition to 4,4'-bis[N-(1-napthyl)-N-phenylamino]biphenyl (NPB), tris(8-quinolinolato)aluminum(III) (Alq), 4,4'-bis[N-(9,9-dimethylfluoren-2-yl)-N-phenylamino]biphenyl (DFLDPBi), bis(2-methyl-8-quinolinolato)(4-phenylphenolato)aluminum(III) (BAlq), and the like.

As a dopant material, for example, a phosphorescent compound or a fluorescent compound can be used. Sepcifically, the following can be given as a phosphorescent compound: (acetylacetonato)bis(2,3,5-triphenylpyrazinato)iridium(III) [(Ir(tppr)$_2$(acac))], bis[2-(4',6'-difluorophenyl)pyridinato-N,C$^{2'}$]iridium(III)picolinate (FIrpic), tris(2-phenylpyridinato-N,C$^{2'}$)iridium(III) (Ir(ppy)$_3$), bis(2-phenylpyridinato-N,C$^{2'}$)iridium(III)acetylacetonate (Ir(ppy)$_2$(acac)), bis(2-phenylbenzothiazolato-N,C$^{2'}$)iridium(III)acetylacetonate (Ir(bt)$_2$(acac)), tris(2-phenylquinolinato-N,C$^{2'}$)iridium(III) (Ir(pq)$_3$), bis(2-phenylquinolinato-N,C$^{2'}$)iridium(III) acetylacetonate (Ir(pq)$_2$(acac)), bis[2-(2'-benzo[4,5-a]thienyl)pyridinato-N,C$^{3'}$]iridium(III)acetylacetonate (Ir(btp)$_2$(acac)), bis(1-phenylisoquinolinato-N,C$^{2'}$)iridium(III) acetylacetonate (Ir(piq)$_2$(acac)), (acetylacetonato)bis[2,3-bis(4-fluorophenyl)quinoxalinato]iridium(III) (Ir(Fdpq)$_2$ (acac)), 2,3,7,8,12,13,17,18-octaethyl-21H,23H-porphyrinplatinum(II) (PtOEP), and the like. Specifically, the following can be given as a fluorescent compound: perylene, 2,5,8,11-tetra(tert-butyl)perylene (TBP), 4,4'-bis[2-(N-ethylcarbazol-3-yl)vinyl]biphenyl (BCzVBi), 5,12-diphenyltetracene, N,N-dimethylquinacridone (DMQd), N,N'-diphenylquinacridone (DPQd), 4-dicyanomethylene-2-isopropyl-6-[2-(1,1,7,7-tetramethyljulolidin-9-yl)ethenyl]-4H-pyran (DCJTI), rubrene, coumarin 6, coumarin 30, and the like. In addition to the above-described examples, 9-(4-{N-[4-(carbazol-9-yl)phenyl]-N-phenylamino}phenyl)-10-phenylanthracene (YGAPA) and the like can be given.

In addition, in the case where the light-emitting element shown in FIG. 3B, in which the layers with various functions are stacked, is formed, a procedure may be repeated in which a layer containing an evaporation material is formed over a supporting substrate, the supporting substrate is placed so as to face a deposition substrate, the layer containing an evaporation material formed over the supporting substrate is heated to be vaporized, whereby a function layer is formed on the deposition substrate. For example, a layer containing an evaporation material which serves as an evaporation source for forming the hole injecting layer is formed over the supporting substrate, and the supporting substrate is placed so as to face the deposition substrate, and then the layer containing an evaporation material formed over the supporting substrate is heated to be vaporized, whereby the hole injecting layer 322 is formed on the deposition substrate. In this embodiment mode, the deposition substrate is the substrate 300, which is provided with the first electrode layer 302 in advance. Subsequently, a layer containing an evaporation material which serves as an evaporation source for forming the hole transporting layer is formed over the supporting substrate, and the supporting substrate is placed so as to face the deposition substrate, and then the layer containing an evaporation material formed over the supporting substrate is heated to be vaporized, whereby the hole transporting layer 324 is formed on the hole injecting layer 322 on the deposition substrate. After that, the light-emitting layer 304, the electron transporting layer 326, and the electron injecting layer 328 are stacked in this order in a similar manner, and then the second electrode layer 306 is formed.

Each of the hole injecting layer 322, the hole transporting layer 324, the electron transporting layer 326, and the electron injecting layer 328 may be formed using various EL materials. Each layer may be formed using one type of material or a composite material of plural kinds of materials. In the case where each layer is formed using a composite material, a plurality of layers containing evaporation materials may be stacked to form an evaporation source as described in Embodiment Mode 1. Also in the case where each layer is formed using one type of material, the deposition method described in Embodiment Mode 1 can be applied. Specifically, a layer containing an evaporation material which serves as an evaporation source may be formed in such a manner that a material in which a desired material is dissolved or dispersed in a solvent is applied by a wet process. In addition, each of the hole injecting layer 322, the hole transporting layer 324, the electron transporting layer 326, and the electron injecting layer 328 may have a single-layer structure or a stacked-layer structure. For example, the hole transporting layer 324 may have a stacked-layer structure in which a first hole transporting layer and a second hole transporting layer are stacked. In addition, the electrode layer can be formed by the deposition method described in Embodiment Mode 1.

For example, a hole injecting layer can be formed using the evaporation source described in Embodiment Mode 1. Specifically, a stacked layer of a layer containing a substance which has a high hole transporting property and a layer containing a substance which exhibits an electron accepting property is used as an evaporation source, whereby a layer containing a substance which has a high hole transporting property and exhibits an electron accepting property is formed to be used as a hole injecting layer.

The layer containing a substance which has a high hole transporting property and a substance which exhibits an electron accepting property has a high carrier density and an excellent hole injecting property. In addition, the layer containing a substance which has a high hole transporting property and a substance which exhibits an electron accepting property is used as a hole injecting layer which is in contact with an electrode which functions as an anode, whereby various kinds of metal, alloys, electrically conductive compounds, mixtures thereof, or the like can be used for the electrode regardless of the work function of a material of the electrode which functions as an anode.

As the substance which exhibits an electron accepting property, which is used for the hole injecting layer, 7,7,8,8-tetracyano-2,3,5,6-tetrafluoroquinodimethane ($F_4$-TCNQ), chloranil, and the like can be given. In addition, transition metal oxide can be given. Moreover, oxide of metal which belongs to Group 4 to Group 8 of the periodic table can be given. Specifically, vanadium oxide, niobium oxide, tantalum oxide, chromium oxide, molybdenum oxide, tungsten oxide, manganese oxide, and rhenium oxide are preferable because of high electron accepting property. Above all, molybdenum oxide is particularly preferable because it is stable even in atmospheric air, has a low hygroscopic property, and is easy to handle.

As a substance with a high hole transporting property which is used for the hole injecting layer, various compounds such as aromatic amine compounds, carbazole derivatives, aromatic hydrocarbon, and a high molecular weight compound (such as oligomer, dendrimer, or polymer) can be used. A substance which has a hole mobility of greater than or equal to $10^{-6}$ cm$^2$/Vs is desirably used as a substance with a high hole transporting property which is used for the hole injecting layer. However, other substances may also be used as long as the hole transporting properties thereof are higher than the electron-transporting properties thereof. Specific substances with a high hole transporting property which can be used for the hole injecting layer will be hereinafter given.

For example, as an aromatic amine compound which can be used for the hole injecting layer, the following can be given: N,N'-bis(4-methylphenyl)(p-tolyl)-N,N'-diphenyl-p-phenylenediamine (DTDPPA); 4,4'-bis[N-(4-diphenylaminophenyl)-N-phenylamino]biphenyl (DPAB); 4,4'-bis(N-{4-[N-(3-methylphenyl)-N-phenylamino]phenyl}-N-phenylamino)biph enyl (DNTPD); 1,3,5-tris[N-(4-diphenylaminophenyl)-N-phenylamino]benzene (DPA3B); and the like.

As a carbazole derivative which can be used for the hole injecting layer, the following can be given specifically: 3-[N-(9-phenylcarbazol-3-yl)-N-phenylamino]-9-phenylcarbazole (PCzPCA1); 3,6-bis[N-(9-phenylcarbazol-3-yl)-N-phenylamino]-9-phenylcarbazole (PCzPCA2); 3-[N-(1-naphthyl)-N-(9-phenylcarbazol-3-yl)amino]-9-phenylcarbazole (PCzPCN1); and the like.

In addition, as a carbazole derivative which can be used for the hole injecting layer, the following can be used: 4,4'-di(N-carbazolyl)biphenyl (CBP); 1,3,5-tris[4-(N-carbazolyl)phenyl]benzene (TCPB); 9-[4-(10-phenyl-anthryl)phenyl]-9H-carbazole (CzPA); 1,4-bis[4-(N-carbazolyl)phenyl]-2,3,5,6-tetraphenylbenzene; and the like.

As aromatic hydrocarbon which can be used for the hole injecting layer, the following can be given, for example: 2-tert-butyl-9,10-di(2-naphthyl)anthracene (t-BuDNA); 2-tert-butyl-9,10-di(1-naphthyl)anthracene; 9,10-bis(3,5-diphenylphenyl)anthracene (DPPA); 2-tert-butyl-9,10-bis(4-phenylphenyl)anthracene (t-BuDBA); 9,10-di(2-naphthyl)anthracene (DNA); 9,10-diphenylanthracene (DPAnth); 2-tert-butylanthracene (t-BuAnth); 9,10-bis(4-methyl-1-naphthyl)anthracene (DMNA); 9-10-bis[2-(1-naphthyl)phenyl]2-tert-butyl-anthracene; 9,10-bis[2-(1-naphthyl)phenyl] anthracene; 2,3,6,7-tetramethyl-9,10-di(1-naphthyl) anthracene; 2,3,6,7-tetramethyl-9,10-di(2-naphthyl) anthracene; 9,9'-bianthryl; 10,10'-diphenyl-9,9'-bianthryl; 10,10'-bis(2-phenylphenyl)-9,9'-bianthryl; 10,10'-bis[(2,3,4,5,6-pentaphenyl)phenyl]-9,9'-bianthryl; anthracene; tetracene; rubrene; perylene; 2,5,8,11-tetra(tert-butyl)perylene; and the like. Besides the above, pentacene, coronene, or the like can also be used. As described above, it is more preferable to use aromatic hydrocarbon which has a hole mobility of $1\times10^{-6}$ cm$^2$/Vs or more and the carbon number of which is 14 to 42.

Note that aromatic hydrocarbon which can be used for the hole injecting layer may have a vinyl skeleton. As aromatic hydrocarbon which has a vinyl group, for example, 4,4'-bis(2,2-diphenylvinyl)biphenyl (DPVBi), 9,10-bis[4-(2,2-diphenylvinyl)phenyl]anthracene (DPVPA), and the like can be given.

The hole injecting layer can be formed with use of an evaporation source in which a layer containing such a substance with a high hole transporting property and a layer containing such a substance which exhibits an electron accepting property are stacked. When metal oxide is used as a substance which exhibits an electron accepting property, it is desirable to form a layer containing metal oxide after a layer containing a substance with a high hole transporting property is formed over a first substrate. This is because, in many cases, the evaporation temperature of metal oxide is higher than that of a substance with a high hole transporting property. The evaporation source with such a structure makes it possible to efficiently sublimate a substance with a high hole transporting property and metal oxide. In addition, local non-uniformity of the concentration in a film formed by evaporation can be suppressed. Moreover, there are few kinds of solvents which dissolve or disperse both a substance with a high hole transporting property and metal oxide, and a mixed solution is not easily formed. Therefore, it is difficult to directly form a mixed layer by a wet process. However, the use of the manufacturing method of the present invention makes it possible to easily form a mixed layer containing a substance with a high hole transporting property and metal oxide.

In addition, the layer containing a substance with a high hole transporting property and a substance which exhibits an electron accepting property is excellent in not only a hole injecting property but also a hole transporting property, and thus the above-described hole injecting layer may be used as the hole transporting layer.

Note that there is no particular limitation on the stacked structure of the EL layer 308, and a light-emitting layer may be combined, as appropriate, with a layer containing a substance with a high electron transporting property, a substance with a high hole transporting property, a substance with a high electron injecting property, a substance with a high hole injecting property, a substance with a bipolar property (a substance with a high electron transporting property and a high hole transporting property), or the like to form the EL layer 308.

Light emission is extracted to the outside through one or both of the first electrode layer 302 and the second electrode layer 306. Thus, one or both of the first electrode layer 302 and the second electrode layer 306 is a light-transmitting electrode. In the case where only the first electrode layer 302 is a light-transmitting electrode, light is extracted from the substrate 300 side through the first electrode layer 302. In addition, in the case where only the second electrode layer 306 is a light-transmitting electrode, light is extracted from the side opposite to the substrate 300 through the second electrode layer 306. In the case where both the first electrode layer 302 and the second electrode layer 306 are light-transmitting electrodes, light is extracted from both the substrate 300 side and the side opposite to the substrate 300 through the first electrode layer 302 and the second electrode layer 306.

Figure 4A:
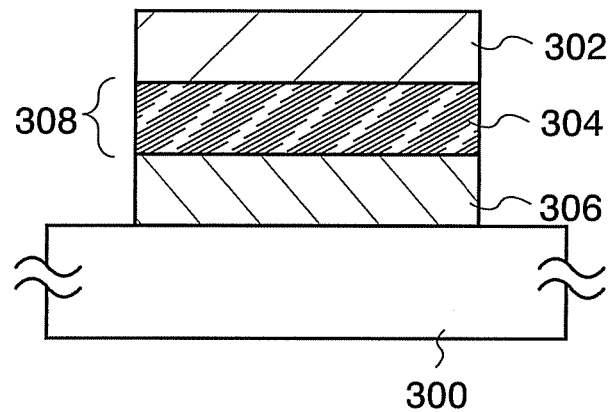
FIGS. 4A and 4B are views each showing an example of a light-emitting element.
Figure 4B:
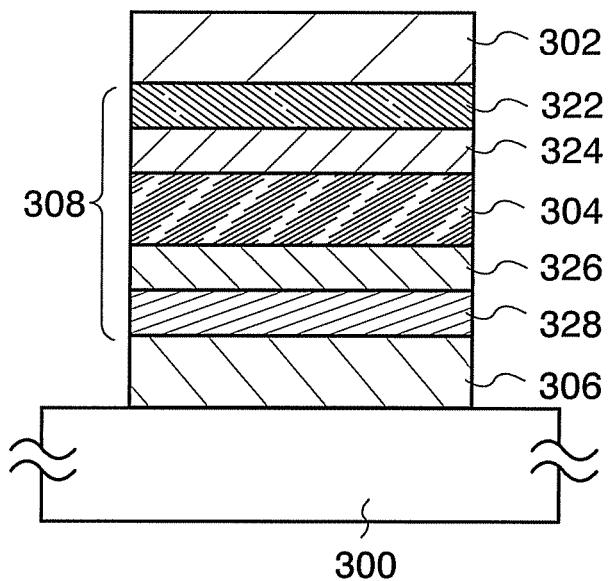

Note that, although the structure in which the first electrode layer 302 functioning as an anode is provided on the substrate 300 side is described in FIGS. 3A and 3B, the second electrode layer 306 functioning as a cathode may be provided on the substrate 300 side. In FIGS. 4A and 4B, structures in which the second electrode layer 306 functioning as a cathode, the EL layer 308, and the first electrode layer 302 functioning as an anode are stacked in order over the substrate 300 are shown. In the EL layer 308 shown in FIG. 4B, layers are stacked in an order opposite to that of the EL layer 308 shown in FIG. 3B.

As a formation method of the EL layer, the deposition method described in Embodiment Mode 1 may be used, or the deposition method of Embodiment Mode 1 may be combined with another deposition method. In addition, each electrode or each layer may be formed by a different deposition method. As a dry process used as the formation method of the EL layer, there are a vacuum evaporation method, a sputtering method, and the like. As a wet process used as the formation method of the EL layer, there are an ink-jet method, a spin coating method, and the like.

Through the above-described steps, the light-emitting element can be manufactured. As for the light-emitting element of this embodiment mode, the layers with a variety of functions, including the light-emitting layer, can be formed easily by application of the present invention. A light-emitting device can be manufactured by application of such a light-emitting element. For example, an example of a passive matrix light-emitting device manufactured by application of the present invention will be described with reference to FIGS. 5A to 5C, FIG. 6, and FIG. 7.

In a passive matrix (also referred to as simple matrix) light-emitting device, a plurality of anodes arranged in stripes and a plurality of cathodes arranged in stripes are provided so as to intersect at right angles, and a light-emitting layer is interposed at each intersecting point of the anode and the cathode. Thus, a pixel at an intersection of an anode which is selected (to which voltage is applied) and a cathode which is selected emits light.

Figure 5A:
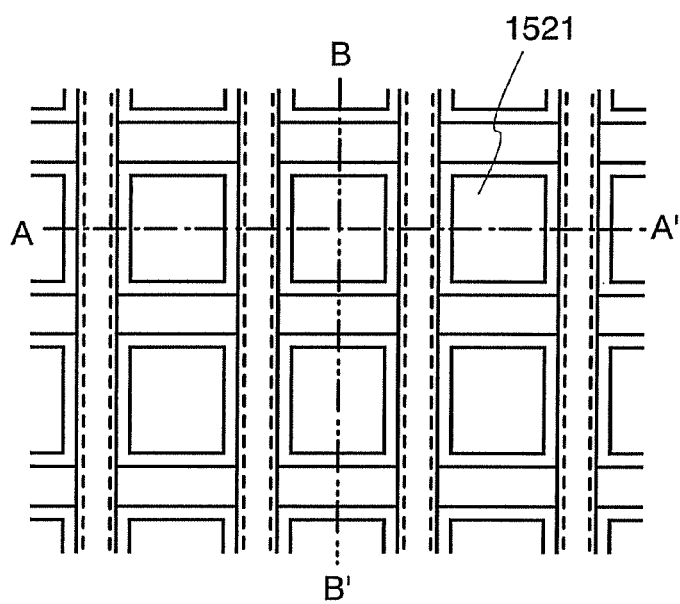
FIG. 5A is a top view of an example of a passive matrix light-emitting device and FIGS. 5B and 5C are cross-sectional views of examples of the same.
Figure 5C:
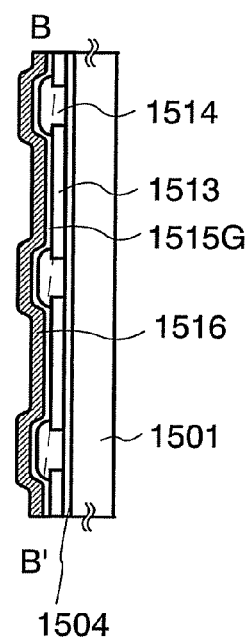
Figure 5B:
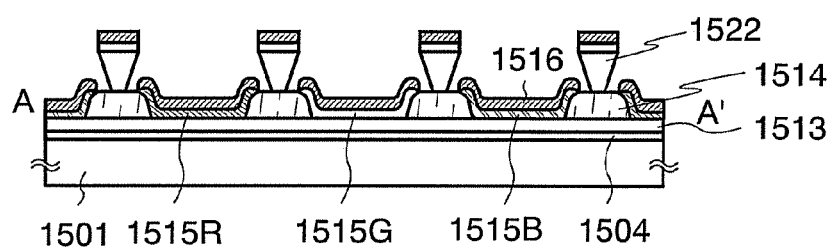

FIG. 5A is a top view of a pixel portion before sealing. FIG. 5B is a cross-sectional view taken along a dashed line A-A' in FIG. 5A. FIG. 5C is a cross-sectional view taken along a dashed line B-B' in FIG. 5A.

An insulating layer 1504 is formed as a base insulating layer over a first substrate 1501. Note that the insulating layer 1504 is not necessarily formed if the base insulating layer is not needed. A plurality of first electrode layers 1513 is arranged in stripes at regular intervals over the insulating layer 1504. A partition wall 1514 having openings corresponding to pixels is provided over the first electrode layers 1513. The partition wall 1514 having openings is formed using an insulating material (a photosensitive or non-photosensitive organic material (e.g., polyimide, acrylic, polyamide, polyimide amide, a resist, or benzocyclobutene) or an SOG film (e.g., a $SiO_x$ film including an alkyl group)). Note that each opening corresponding to a pixel is a light-emitting region 1521.

A plurality of inversely-tapered partition walls 1522 parallel to each other is provided over the partition wall 1514 having openings to intersect with the first electrode layers 1513. The inversely-tapered partition walls 1522 are formed by a photolithography method using a positive-type photosensitive resin, portion of which unexposed to light remains as a pattern, and by adjustment of the amount of light exposure or the length of development time so that a lower portion of a pattern is etched more.

Figure 6:
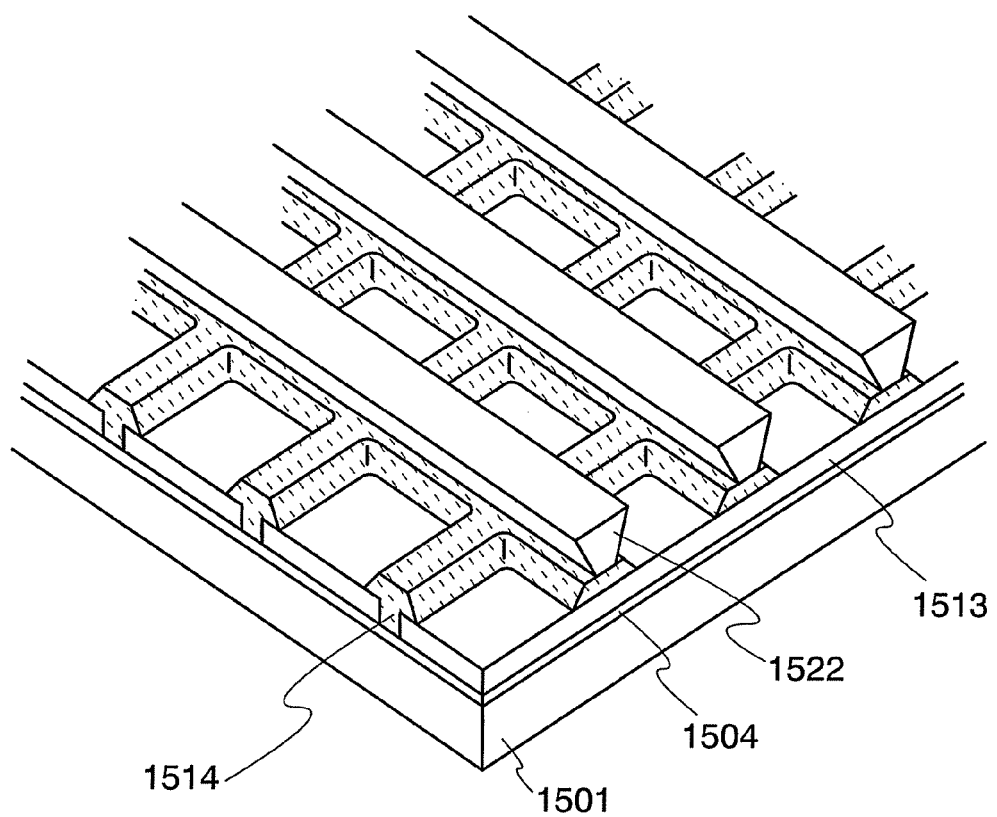
FIG. 6 is a perspective view of an example of a passive matrix light-emitting device.

FIG. 6 is a perspective view immediately after formation of the plurality of inversely-tapered partition walls 1522 parallel to each other. Note that the same reference numerals are used to denote the same portions as those in FIGS. 5A to 5C.

The total thickness of the partition wall 1514 having openings and the inversely-tapered partition wall 1522 is set to be larger than the total thickness of an EL layer including a light-emitting layer and a conductive layer which serves as a second electrode layer. When the conductive layer and the EL layer including a light-emitting layer are stacked over the first substrate having the structure shown in FIG. 6, the stacked layer is separated into a plurality of regions, which are stacked layers of a second electrode layer 1516 and an EL layer 1515R including a light-emitting layer; the second electrode layer 1516 and an EL layer 1515G including a light-emitting layer; and the second electrode layer 1516 and an EL layer 1515B including a light-emitting layer, as shown in FIGS. 5A to 5C. Note that the plurality of separated regions is electrically isolated from one another. The second electrode layers 1516 are electrodes in stripes, which are parallel to one another and extend along a direction intersecting with the first electrode layers 1513. Note that, although stacked layers each including the conductive layer and the EL layer including a light-emitting layer are also formed over the inversely-tapered partition walls 1522, they are separated from the stacked layers of the second electrode layer 1516 and the EL layer 1515R including a light-emitting layer; the second electrode layer 1516 and the EL layer 1515G including a light-emitting layer; and the second electrode layer 1516 and the EL layer 1515B including a light-emitting layer. Note that, in this embodiment mode, the EL layer refers to a layer including at least a light-emitting layer and may include a hole injecting layer, a hole transporting layer, an electron transporting layer, an electron injecting layer, and/or the like in addition to the light-emitting layer.

This embodiment mode describes an example of forming a light-emitting device, which provides three kinds of light emissions (R, G, and B) and is capable of performing full color display, by selective formation of the EL layers 1515R, 1515G, and 1515B each including a light-emitting layer. The EL layers 1515R, 1515G, and 1515B each including a light-emitting layer are formed into a stripe pattern parallel to one another. The deposition method described in Embodiment Mode 1 may be used for forming these EL layers. For example, a first supporting substrate over which an evaporation source of a light-emitting layer from which red emission is obtained is formed, a second supporting substrate over which an evaporation source of a light-emitting layer from which green emission is obtained is formed, and a third supporting substrate over which an evaporation source of a light-emitting layer from which blue emission is obtained is formed are prepared. In addition, a substrate provided with the first electrode layers 1513 is prepared as a deposition substrate. Then, the first supporting substrate, the second supporting substrate, or the third supporting substrate is placed so as to face the deposition substrate as appropriate, and the evaporation source formed over the supporting substrate is heated to be vaporized, whereby the EL layer including a light-emitting layer is formed on the deposition substrate. Note that a mask or the like is used as appropriate in order to selectively form the EL layer at a desired position.

Alternatively, EL layers each including a light-emitting layer which emits light of the same emission color may be formed over an entire surface to provide a monochromatic light-emitting elements, whereby a light-emitting device which is capable of performing monochromatic display or a light-emitting device which is capable of performing area color display may be provided. Further alternatively, a light-emitting device which is capable of performing full color display may be provided by combination of a light-emitting device which provides white light emission and color filters.

In addition, if necessary, sealing is performed using a sealing material such as a sealing can or a glass substrate for sealing. Here, a glass substrate is used as a second substrate, and a first substrate and the second substrate are attached to each other using an adhesive material such as a sealant, whereby a space surrounded by the adhesive material such as a sealant is sealed off. The sealed space is filled with filler or a dry inert gas. In addition, a desiccant or the like may be put between the first substrate and the sealing material so that reliability of the light-emitting device is increased. A small amount of moisture is removed by the desiccant, whereby sufficient drying is performed. As the desiccant, a substance which adsorbs moisture by chemical adsorption, such as an oxide of an alkaline earth metal such as calcium oxide or barium oxide, can be used. Alternatively, a substance which adsorbs moisture by physical adsorption, such as zeolite or silica gel, can be used as another desiccant.

Note that a desiccant is not necessarily provided in the case where a sealing material which is in contact with the light-emitting element to cover the light-emitting element is provided and the light-emitting element is sufficiently blocked from outside air.

Figure 7:
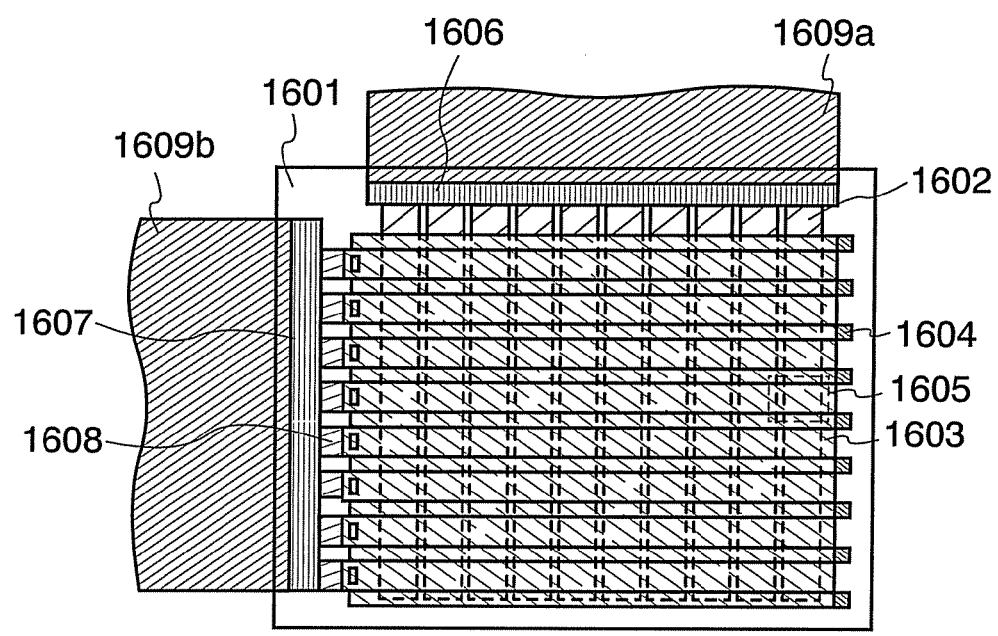
FIG. 7 is a top view of an example of a passive matrix light-emitting device.

FIG. 7 is a top view of a light-emitting module mounted with an FPC or the like.

Note that the light-emitting device in this specification refers to an image display device, a light-emitting device, or a light source (including a lighting system). In addition, the light-emitting device includes any of the following modules in its category: a module in which a connector such as an FPC (flexible printed circuit), a TAB (tape automated bonding) tape, or a TCP (tape carrier package) is attached to a light-emitting device; a module having a TAB tape or a TCP provided with a printed wiring board at the end thereof; and a module having an IC (integrated circuit) directly mounted over a substrate over which a light-emitting element is formed by a COG (chip on glass) method.

In a pixel portion for displaying images, scan lines and data lines intersect with each other so as to cross at right angles, as shown in FIG. 7.

The first electrode layers 1513 in FIGS. 5A to 5C correspond to scan lines 1603 in FIG. 7, the second electrode layers 1516 correspond to data lines 1602, and the inversely-tapered partition walls 1522 correspond to partition walls 1604. Light-emitting layers are interposed between the data lines 1602 and the scan lines 1603, and an intersection portion indicated by a region 1605 corresponds to one pixel.

Note that the scan lines 1603 are electrically connected at their ends to connection wirings 1608, and the connection wirings 1608 are connected to an FPC 1609b through an input terminal 1607. The data lines 1602 are connected to an FPC 1609a through an input terminal 1606.

If necessary, a polarizing plate, a circularly polarizing plate (including an elliptically polarizing plate), a retardation plate (a quarter-wave plate or a half-wave plate), or an optical film such as a color filter may be appropriately provided over a light-emitting surface. Further, the polarizing plate or the circularly polarizing plate may be provided with an anti-reflection film. For example, anti-glare treatment may be carried out by which reflected light can be diffused by projections and depressions on the surface so as to reduce the glare.

Through the above-described steps, the passive matrix light-emitting device can be manufactured. Application of the present invention makes it possible to easily form an organic compound layer included in a light-emitting element and to manufacture a light-emitting device including the light-emitting element. In addition, less complicated control is needed in the case where a light-emitting layer in which a dopant material is dispersed in a host material is formed than in the case where co-evaporation is applied. Moreover, since it is easy to control the additive amount of dopant material, or the like, deposition can be performed easily and precisely, and thus desired emission color can be easily obtained. Furthermore, efficiency in the use of evaporation materials can be increased, and thus cost reduction can be achieved.

Although the example in which a driver circuit is not provided over the substrate is shown in FIG. 7, the present invention is not limited to the example, and an IC chip including a driver circuit may be mounted on the substrate.

In the case where an IC chip is mounted, a data line side IC and a scan line side IC, in each of which a driver circuit for transmitting a signal to the pixel portion is formed, are mounted on the periphery of (outside) the pixel portion by a COG method. The mounting may be performed using a TCP or a wire bonding method other than a COG method. A TCP is a TAB tape mounted with an IC, and the TAB tape is connected to a wiring over an element formation substrate to mount the IC. Each of the data line side IC and the scan line side IC may be formed using a silicon substrate. Alternatively, it may be that in which a driver circuit is formed using TTTs over a glass substrate, a quartz substrate, or a plastic substrate. Although described here is an example in which a single IC is provided on one side, a plurality of divided ICs may be provided on one side.

Next, an example of an active matrix light-emitting device which is manufactured by application of the present invention will be described with reference to FIGS. 8A and 8B. Note that FIG. 8A is a top view showing a light-emitting device and FIG. 8B is a cross-sectional view taken along the chain line A-A' in FIG. 8A. The active matrix light-emitting device of this embodiment mode includes a pixel portion 1702 provided over an element substrate 1710, a driver circuit portion (a source side driver circuit) 1701, and a driver circuit portion (a gate side driver circuit) 1703. The pixel portion 1702, the driver circuit portion 1701, and the driver circuit portion 1703 are sealed, with a sealant 1705, between the element substrate 1710 and a sealing substrate 1704.

In addition, over the element substrate 1710, a lead wiring 1708 for connecting an external input terminal which transmits a signal (e.g., a video signal, a clock signal, a start signal, or a reset signal) or an electric potential to the driver circuit portion 1701 and the driver circuit portion 1703 is provided. In this embodiment mode, an example in which an FPC (flexible printed circuit) 1709 is provided as the external input terminal is shown. Note that, although only the FPC is shown in the drawing, the FPC may be provided with a PWB (printed wiring board). The light-emitting device in this specification includes, in its category, not only a light-emitting device itself but also a light-emitting device with an FPC or a PWB attached thereto.

Next, the cross-sectional structure will be described with reference to FIG. 8B. Although the driver circuit portions and the pixel portion are formed over the element substrate 1710, in FIG. 8B, the pixel portion 1702 and the driver circuit portion 1701 which is the source side driver circuit are shown.

An example is shown in which a CMOS circuit which is the combination of an n-channel TFT 1723 and a p-channel TFT 1724 is formed as the driver circuit portion 1701. Note that a circuit included in the driver circuit portion may be formed of various CMOS circuits, PMOS circuits, or NMOS circuits. Although a driver-integrated type where the driver circuit is formed over the substrate is described in this embodiment mode, the present invention is not limited to this structure, and the driver circuit may be formed outside the substrate, not over the substrate.

The pixel portion 1702 includes a plurality of pixels, each of which includes a switching TFT 1711, a current-controlling TFT 1712, and a first electrode layer 1713 which is electrically connected to a wiring (a source electrode or a drain electrode) of the current-controlling TFT 1712. Note that an insulator 1714 is formed so as to cover end portions of the first electrode layer 1713. In this embodiment mode, the insulator 1714 is formed using a positive photosensitive acrylic resin.

The insulator 1714 is desirably formed so as to have a curved surface with curvature at an upper end portion or a lower end portion thereof so that the insulator 1714 is sufficiently covered by a film which is to be stacked over the insulator 1714. For example, in the case of using a positive photosensitive acrylic resin as a material for the insulator 1714, the insulator 1714 is desirably formed so as to have a curved surface with a curvature radius (0.2 to 3 μm) at the upper end portion thereof. Either a negative photosensitive material which becomes insoluble in an etchant by light irradiation or a positive photosensitive material which becomes soluble in an etchant by light irradiation can be used for the insulator 1714. As the insulator 1714, without limitation to an organic compound, either an organic compound or an inorganic compound such as silicon oxide or silicon oxynitride can be used.

An EL layer 1700 including a light-emitting layer and a second electrode layer 1716 are stacked over the first electrode layer 1713. The first electrode layer 1713 corresponds to the above-described first electrode layer 302, and the second electrode layer 1716 corresponds to the above-described second electrode layer 306. Note that when an ITO film is used as the first electrode layer 1713, and a stacked film of a titanium nitride film and a film containing aluminum as its main component or a stacked film of a titanium nitride film, a film containing aluminum as its main component, and a titanium nitride film is used as a wiring of the current-controlling TFT 1712 which is connected to the first electrode layer 1713, resistance of the wiring is low and favorable ohmic contact with the ITO film can be obtained. Note that, although not shown in FIGS. 8A and 8B, the second electrode layer 1716 is electrically connected to the FPC 1709 which is an external input terminal.

In the EL layer 1700, at least the light-emitting layer is provided, and in addition to the light-emitting layer, a hole injecting layer, a hole transporting layer, an electron transporting layer, and/or an electron injecting layer are/is provided as appropriate. The first electrode layer 1713, the EL layer 1700, and the second electrode layer 1716 are stacked, whereby a light-emitting element 1715 is formed.

Although only one light-emitting element 1715 is shown in the cross-sectional view of FIG. 8B, a plurality of light-emitting elements is arranged in matrix in the pixel portion 1702. Light-emitting elements which provides three kinds of light emissions (R, G, and B) are selectively formed in the pixel portion 1702, whereby a light-emitting device which is capable of full color display can be manufactured. Alternatively, EL layers each including a light-emitting layer which emits light of the same color may be formed over an entire surface to provide a monochromatic light-emitting elements, whereby a light-emitting device which is capable of performing monochromatic display or a light-emitting device which is capable of performing area color display may be provided. Further alternatively, a light-emitting device which is capable of performing full color display may be provided by combination of a light-emitting device which provides white light emission with color filters.

Furthermore, the sealing substrate 1704 and the element substrate 1710 are attached to each other with the sealant 1705, whereby the light-emitting element 1715 is provided in a space 1707 surrounded by the element substrate 1710, the sealing substrate 1704, and the sealant 1705. Note that the space 1707 may be filled with the sealant 1705 as well as an inert gas (e.g., nitrogen or argon).

Note that an epoxy resin is desirably used as the sealant 1705. In addition, such a material is desirably a material which does not transmit moisture or oxygen as much as possible. As a material used for the sealing substrate 1704, a plastic substrate made of FRP (fiberglass-reinforced plastics), PVF (polyvinyl fluoride), polyester, acrylic, or the like can be used as well as a glass substrate or a quartz substrate.

As described above, the light-emitting device can be obtained by application of the present invention. Since TFTs are manufactured in an active matrix light-emitting device, manufacturing cost per light-emitting device tends to be high; however, the application of the present invention makes it possible to drastically reduce loss of materials in forming light-emitting elements. Thus, reduction in cost can be achieved. In addition, the application of the present invention makes it possible to easily form a light-emitting layer formed of a light-emitting material (a dopant material) which is dispersed in a host material and to easily control the amount of the contained light-emitting material.

Note that this embodiment mode can be combined with other embodiment modes described in this specification as appropriate.

[Embodiment Mode 3]

In this embodiment mode, an example of a deposition apparatus which makes it possible to manufacture a light-emitting device of the present invention will be described. FIGS. 9A to 9C and FIGS. 10A to 10C are each a schematic view of a cross section of a deposition apparatus of this embodiment mode.

Figure 9A:
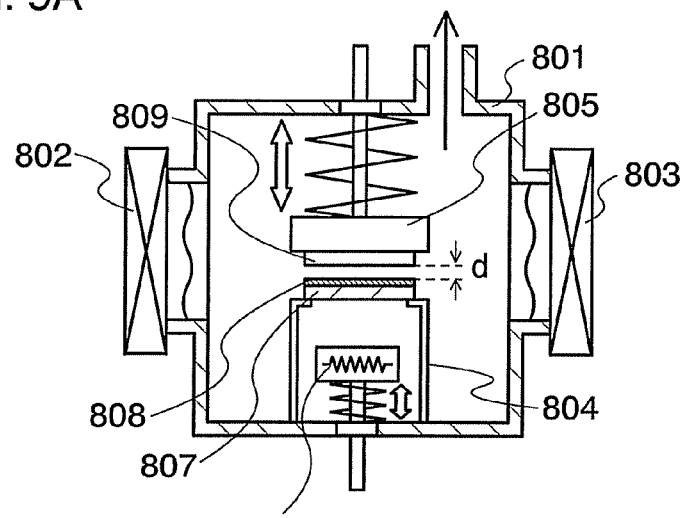
FIGS. 9A to 9C are views showing examples of deposition apparatuses.

In FIG. 9A, a deposition chamber 801 is a vacuum chamber, which is connected to other treatment chambers via a first gate valve 802 and a second gate valve 803. In addition, the deposition chamber 801 is provided with at least a substrate supporting unit which is a first substrate supporting unit 804, a deposition substrate supporting unit which is a second substrate supporting unit 805, and a heater which is capable of vertical movement as a heat source 806.

First, in another deposition chamber, a material layer 808 is formed over a first substrate 807 which is a supporting substrate. In this embodiment mode, the first substrate 807 corresponds to the first substrate 100 shown in FIGS. 1A and 1B, and the material layer 808 corresponds to the plurality of layers 104 containing evaporation materials. In this embodiment mode, a square, flat substrate containing copper as its main component is used as the first substrate 807. As the material layer 808, a stacked layer of a plurality of materials which are capable of being evaporated and the evaporation temperature of which are different from each other. Note that there is no particular limitation on the form of the first substrate 807 as long as the first substrate 807 has an area that is the same as or larger than that of the deposition substrate. In addition, as a formation method of the material layer 808, a dry process or a wet process can be used, and a wet process is preferably used. For example, a spin coating method, a printing method, an ink-jet method, or the like can be used.

The first substrate 807 is transferred from another deposition chamber to the deposition chamber 801 and is set on the substrate supporting unit. In addition, the first substrate 807 is fixed to the substrate supporting unit so that a surface of the first substrate 807, over which the material layer 808 is formed, and a deposition surface of a second substrate 809 which is the deposition substrate face each other.

Figure 9B:
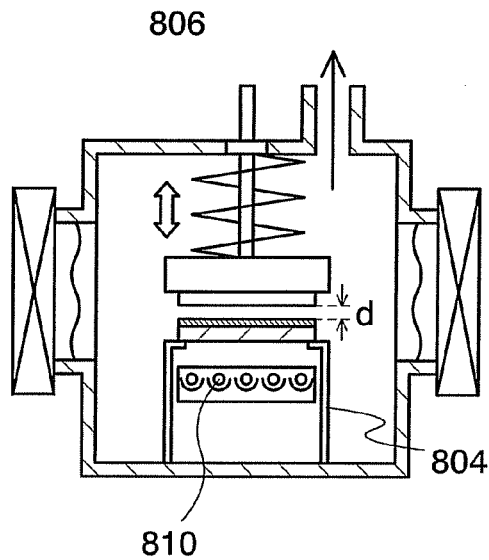
Figure 9C:
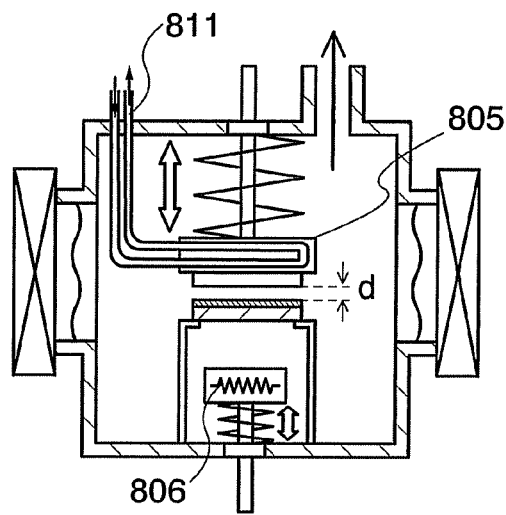

The second substrate supporting unit 805 is moved so that the distance between the first substrate 807 and the second substrate 809 becomes the distance d. Note that the distance d is defined as the distance between a surface of the material layer 808 formed over the first substrate 807 and a surface of the second substrate 809. In addition, in the case where a certain layer (e.g., a conductive layer which functions as an electrode or an insulating layer which functions as a partition wall) is formed on the second substrate 809, the distance d is defined as the distance between the surface of the material layer 808 over the first substrate 807 and the surface of the layer formed on the second substrate 809. Note that the surface of the second substrate 809 or the surface of the layer formed on the second substrate 809 is uneven, the distance d is defined as the shortest distance between the surface of the material layer 808 over the first substrate 807 and the outermost surface of the second substrate 809 or the layer formed on the second substrate 809. In this embodiment mode, the distance d is set to 2 mm. In addition, if the second substrate 809 is hard like a quartz substrate and formed of a material which is not deformed (warped, bent, or the like) much, the distance d can be shortened to 0 mm as the minimum distance. Although the example in which the deposition substrate supporting unit is moved while the substrate supporting unit is fixed for controlling the distance between the substrates is shown in FIGS. 9A to 9C, a structure may also be employed in which the substrate supporting unit is moved while the deposition substrate supporting unit is fixed. Alternatively, both the substrate supporting unit and the deposition substrate supporting unit may be moved. Note that, FIG. 9A shows a cross section of a step in which the second substrate supporting unit 805 is moved so that the first substrate 807 and the second substrate 809 are brought close to each other to have the distance d therebetween.

Alternatively, a structure may also be employed in which the substrate supporting unit and the deposition substrate supporting unit move not only in a vertical direction but also in a horizontal direction and precise alignment is performed. In addition, the deposition chamber 801 may include an alignment mechanism such as CCD for precise alignment or measurement of the distance d. In addition, a sensor for measuring the temperature or humidity inside the deposition chamber 801 may be provided.

The heat source 806 is brought close to the supporting substrate while retaining the distance d between the substrates. Note that it is desirable that the contact area of the heat source 806 with the supporting substrate be large for uniform heating. In FIG. 9A, a heater which is capable of vertical movement is used below the supporting substrate.

When the heat source 806 is brought close to the supporting substrate, the material layer 808 over the supporting substrate is heated to be vaporized in a short time by direct heat conduction, whereby evaporation materials are deposited on a deposition surface (that is, a bottom surface) of the second substrate 809, which is placed so as to face the supporting substrate. When the deposition apparatus shown in FIG. 9A is used, if the material layer 808 with uniform thickness over the first substrate 807 is obtained in advance, the film can be deposited to a uniform thickness on the second substrate 809 without setting a film-thickness monitor. A substrate is rotated in a conventional evaporation apparatus. When the deposition apparatus shown in FIG. 9A is used, on the other hand, deposition is performed while the deposition substrate is stopped, and thus the deposition apparatus is suitable for deposition on a large-area glass substrate which is easily broken. In addition, in the deposition apparatus shown in FIG. 9A, the supporting substrate is also stopped during deposition.

The distance between the heat source 806 and the first substrate 807 (supporting substrate) may be kept long while waiting (before an evaporation process) in order to reduce thermal effects on the material layer 808 over the supporting substrate due to heat radiation from the heat source (heater) while waiting.

The deposition apparatus shown in FIG. 9A is capable of more drastic reduction in the capacity of the chamber in comparison with a conventional evaporation apparatus. Moreover, an openable and closeable shutter for heat insulation may be provided between the heat source 806 and the first substrate 807 (supporting substrate) in order to reduce the capacity of the chamber.

The heat source 806 is not limited to a heater, and any heating unit may be used as long as the heating unit can perform uniform heating in a short time. For example, a lamp 810 may be provided as shown in FIG. 9B. Note that components in FIG. 9B which are the same as those in FIG. 9A are denoted by the same reference numerals. In an example shown in FIG. 9B, the lamp 810 is fixed below a first substrate 807 and a film is deposited on a bottom surface of the second substrate 809 immediately after the lamp 810 is lit. Note that FIG. 9B shows a cross section of a step, before the lamp 810 is lit up, in which the first substrate 807 and the second substrate 809 are brought close to each other to the distance d between the substrates.

As the lamp 810, the following can be used: an electric-discharge lamp such as a flash lamp (e.g., a xenon flash lamp or a krypton flash lamp), a xenon lamp, or a metal halide lamp, or an exothermic lamp such as a halogen lamp or a tungsten lamp. Since a flash lamp is capable of emitting very high-intensity light repeatedly to a large area for a short time (0.1 to 10 msec), it can heat the substrate uniformly and efficiently regardless of the area of the first substrate 807. In addition, heating of the first substrate 807 can be controlled by change of interval of light emission of a flash lamp. Moreover, since the life of a flash lamp is long and power consumption thereof while waiting for light emission is low, running cost can be kept low. Furthermore, the use of a flash lamp makes it possible to easily perform rapid heating and to simplify a vertical mechanism unit, a shutter, or the like in the case where a heater is used. Thus, further reduction in the size of the deposition apparatus can be achieved.

Although FIG. 9B shows the example in which the lamp 810 is set in the deposition chamber 801, part of an inner wall of the deposition chamber may be made of a light-transmitting member and the lamp 810 may be placed outside the deposition chamber. The lamp 810 is placed outside the deposition chamber, whereby maintenance such as replacement of light bulbs of the lamp 810 can be easier.

FIG. 9C shows an example of a deposition apparatus provided with a mechanism for controlling the temperature of the second substrate 809. Components in FIG. 9C which are the same as those in FIGS. 9A and 9B are denoted by the same reference numerals. In FIG. 9C, a tube 811 through which a heat medium flows to the second substrate supporting unit 805 is provided. A refrigerant flows through the tube 811 as a heat medium, whereby the second substrate supporting unit 805 can be a cold plate. The tube 811 has a mechanism in which it can follow the vertical movement of the second substrate supporting unit 805. Note that, although an example in which the tube 811 through which a refrigerant gas or a liquid refrigerant flows is used is described in this embodiment mode, a peltiert element or the like may be provided, as a cooling unit, for the second substrate supporting unit 805. Alternatively, a heating unit may be provided without providing a cooling unit. For example, a heat medium for heating may be flown through the tube 811.

The deposition apparatus shown in FIG. 9C is useful for stacking material layers, evaporation materials of which are different from each other. For example, in the case where a first material layer has been formed on the second substrate 809, a second material layer the evaporation temperature of which is higher than that of the first material layer can be stacked on the first material layer. In FIG. 9A, since the second substrate 809 and the first substrate 807 are close to each other, the first material layer which has been formed on the second substrate 809 might be vaporized. However, when the deposition apparatus shown in FIG. 9C is used, the second material layer can be stacked on the first material layer which has been formed on the second substrate 809 while vaporization of the first material layer is suppressed using a cooling unit.

In addition, the second substrate supporting unit 805 may be provided with a heating unit such as a heater, in addition to the cooling unit. A unit for controlling (heating or cooling) the temperature of the second substrate 809 can prevent warp or the like of the substrate.

Figure 10A:
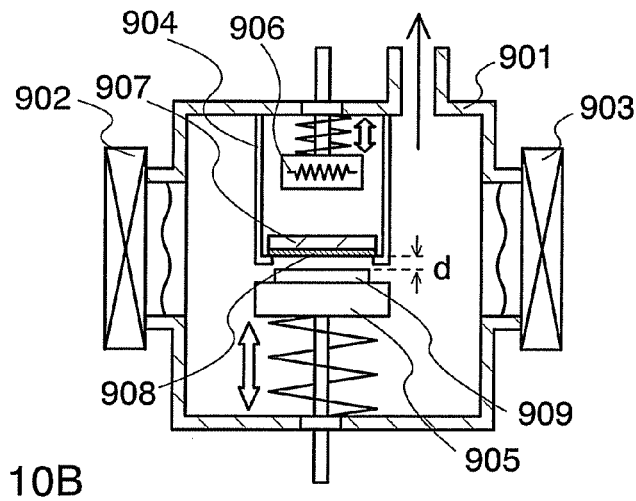
FIGS. 10A to 10C are views showing examples of deposition apparatuses.
Figure 10B:
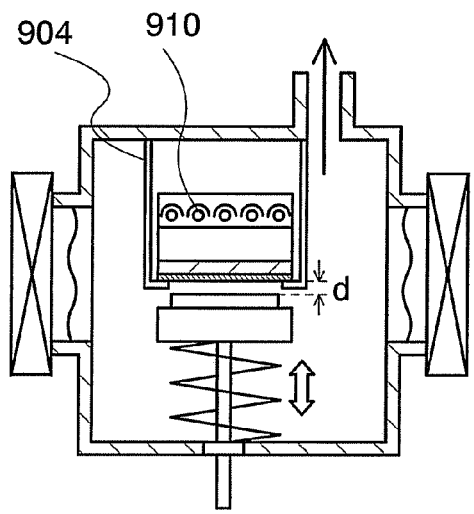

Note that, although FIGS. 9A to 9C each show the example of the deposition apparatus employing a face-down system in which the deposition surface of the deposition substrate faces downward, a deposition apparatus employing a face-up system as shown in FIGS. 10A and 10B may also be applied.

In FIG. 10A, a deposition chamber 901 is a vacuum chamber which is connected to other treatment chambers via a first gate valve 902 and a second gate valve 903. In addition, the deposition chamber 901 is provided with at least a deposition substrate supporting unit which is a first substrate supporting unit 905, a substrate supporting unit which is a second substrate supporting unit 904, and a heater which is capable of vertical movement as a heat source 906.

The procedure of deposition will be hereinafter described. First, in another deposition chamber, a material layer 908 is formed over a second substrate 907 which is a supporting substrate. In this embodiment mode, the second substrate 907 corresponds to the first substrate 100 shown in FIGS. 1A and 1B. There is no particular limitation on the form of the second substrate 907 as long as the second substrate 907 has an area that is the same as or larger than that of the deposition substrate. The material layer 908 corresponds to the plurality of layers 104 containing evaporation materials and contains a plurality of materials which are capable of being evaporated and the evaporation temperatures of which are different from each other. The material layer 908 can be formed by a dry process or a wet process. In particular, a wet process is preferably used. For example, a spin coating method, a printing method, an ink-jet method, or the like can be used.

The second substrate 907 is transferred from another deposition chamber to the deposition chamber 901 and is set on the substrate supporting unit. In addition, the second substrate 907 is fixed to the substrate supporting unit so that a surface of the second substrate 907, over which the material layer 908 is formed, and a surface of a first substrate 909 face each other. In addition, as shown in FIG. 10A, this structure is an example of a face-up system in which the deposition surface of the substrate face upward. In the case of the face-up system, a large-area glass substrate which is easily bent is put on a flat board, or the glass substrate is supported by a plurality of pins, whereby the substrate has no flexure, and thus a deposition apparatus can be realized in which a uniform thickness over an entire surface of the substrate can be obtained.

The first substrate supporting unit 905 is moved so that the distance between the second substrate 907 and the first substrate 909 becomes the distance d. Note that the distance d is defined as the distance between a surface of the material layer 908 formed on the second substrate 907 and a surface of the first substrate 909. In addition, in the case where a certain layer (e.g., a conductive layer which functions as an electrode or an insulating layer which functions as a partition wall) is formed over the first substrate 909, the distance d is defined as the distance between the surface of the material layer 908 on the second substrate 907 and a surface of the layer formed over the first substrate 909. Note that the surface of the first substrate 909 or the surface of the layer formed over the first substrate 909 is uneven, the distance d is defined as the shortest distance between the surface of the material layer 908 on the second substrate 907 and the outermost surface of the first substrate 909 or the layer formed over the first substrate 909. In this embodiment, the distance d is set to 5 mm. In addition, although the example is described in which the deposition substrate supporting unit is moved while the substrate supporting unit is fixed, the substrate supporting unit may be moved while the deposition substrate supporting unit is fixed. Moreover, the distance d may be controlled in such a manner that both the substrate supporting unit and the deposition substrate supporting unit are moved.

As shown in FIG. 10A, a heat source 906 is brought close to the supporting substrate while retaining the distance d between the substrates. Note that it is desirable that the contact area of the heat source 906 with the supporting substrate be large for uniform heating. In FIG. 10A, a heater which is capable of vertical movement is used above the supporting substrate.

When the heat source 906 is brought close to the supporting substrate, the material layer 908 on the supporting substrate is heated to be vaporized in a short time by direct heat conduction, whereby evaporation materials are deposited over a deposition surface (that is, an upper surface) of the first substrate 909, which is placed so as to face the supporting substrate. This makes it possible to realize a small-sized deposition apparatus the capacity of which is drastically smaller than that of a conventional evaporation apparatus which is a large-capacity chamber.

The heat source 906 is not limited to a heater, and any heating unit may be used as long as the heating unit can perform uniform heating in a short time. For example, a lamp 910 may be provided as shown in FIG. 10B. Note that components in FIG. 10B which are the same as those in FIG. 10A are denoted by the same reference numerals. In an example shown in FIG. 10B, the lamp 910 is fixed above the second substrate and a film is deposited over an upper surface of the first substrate 909 immediately after the lamp 810 is lit up.

Figure 10C:
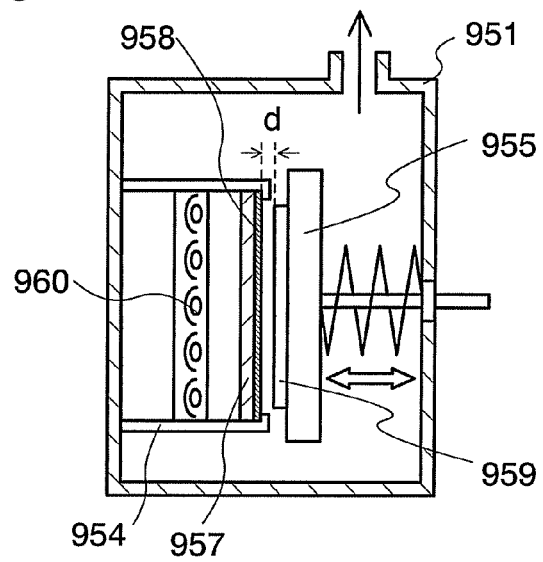

Note that, although FIGS. 9A to 9C and FIGS. 10A and 10B each show the example of the deposition apparatus employing a system in which substrates are arranged horizontally, a deposition apparatus employing a system in which substrates are arranged vertically as shown in FIG. 10C can also be applied.

In FIG. 10C, a deposition chamber 951 is a vacuum chamber. In addition, the deposition chamber 951 is provided with at least a substrate supporting unit which is a first substrate supporting unit 954, a deposition substrate supporting unit which is a second substrate supporting unit 955, and a lamp 960 as a heat source.

Although not shown, the deposition chamber 951 is connected to a first transfer chamber to which the deposition substrate is transferred while keeping its vertical arrangement and to a second transfer chamber to which the supporting substrate is transferred while keeping its vertical arrangement. In this specification, "vertical arrangement" of a substrate refers to placement of a substrate in which a substrate surface makes an angle which is nearly vertical (ranging from 70 to 100°) with a horizontal surface. Since a large-area glass substrate or the like is easily bent, it is desirably transferred with the vertical arrangement.

The lamp 960 is more suitable than a heater as the heat source, for heating a large-area glass substrate.

The procedure of deposition will be hereinafter described. First, in another deposition chamber, a material layer 958 is formed over one of surfaces of a first substrate 957 which is a supporting substrate. The first substrate 957 corresponds to the first substrate 100 shown in FIGS. 1A and 1B, and the material layer 958 corresponds to the plurality of layers 104 containing evaporation materials.

Next, the first substrate 957 is transferred from another deposition chamber to the deposition chamber 951 and is set on the substrate supporting unit. In addition, the first substrate 957 is fixed to the substrate supporting unit so that the surface of the first substrate 957, over which the material layer 958 is formed, and the deposition surface of a second substrate 959 face each other.

Next, light is emitted from the lamp 960 to rapidly heat the supporting substrate, while retaining the distance d between the substrates. When the supporting substrate is rapidly heated, the material layer 958 over the supporting substrate is heated to be vaporized in a short time by indirect heat conduction, whereby evaporation materials are deposited on the deposition surface of the second substrate 959, which is the deposition substrate placed so as to face the supporting substrate. This makes it possible to realize a small-sized deposition apparatus the capacity of which is drastically smaller than that of a conventional evaporation apparatus which is a large-capacity chamber.

A plurality of deposition apparatuses described in this embodiment mode is provided, whereby a multi-chamber manufacturing apparatus can be obtained. Needless to say, the deposition apparatus can be combined with a deposition apparatus employing another deposition method. Alternatively, a plurality of deposition apparatuses described in this embodiment mode is arranged in series, whereby an in-line manufacturing apparatus can be obtained.

In addition, evaporation treatment can also be performed in such a manner that, in the deposition apparatuses shown in FIGS. 9A to 9C and FIGS. 10A to 10C, a conductive substrate is used as each of the supporting substrates which are the first substrate 807, the second substrate 907, and the first substrate 957, current is passed through the supporting substrate to heat the supporting substrate. In this case, the supporting substrate itself functions as part of a heat source.

The use of such a deposition apparatus makes it possible to manufacture the light-emitting device of the present invention. In the present invention, the evaporation source can be easily prepared by a wet process. In addition, since the evaporation source can be evaporated as it is, a film-thickness monitor is not needed. Therefore, the deposition process can be fully automated, and accordingly throughput can be increased. Moreover, evaporation materials can be prevented from being attached to an inner wall of a deposition chamber, and thus maintenance of the deposition apparatus can be easier.

Note that this embodiment mode can be combined with other embodiment modes described in this specification as appropriate.

[Embodiment Mode 4]

In this embodiment mode, with reference to FIGS. 11A to 11E, a variety of electronic devices which are completed by use of a light-emitting device manufactured by application of the present invention will be described.

As electronic devices to which the light-emitting device of the present invention is applied, the following are given: televisions, cameras such as video cameras or digital cameras, goggle type displays (head mount displays), navigation systems, audio reproducing devices (e.g., car audio component stereos and audio component stereos), laptop personal computers, game machines, portable information terminals (e.g., mobile computers, cellular phones, portable game machines, and electronic books), and image reproducing devices provided with recording media (specifically, the devices that can reproduce a recording medium such as a digital versatile disc (DVD) and is provided with a display device capable of displaying the reproduced images), lighting equipment, and the like. Specific examples of these electronic devices are shown in FIGS. 11A to 11E.

Figure 11A:
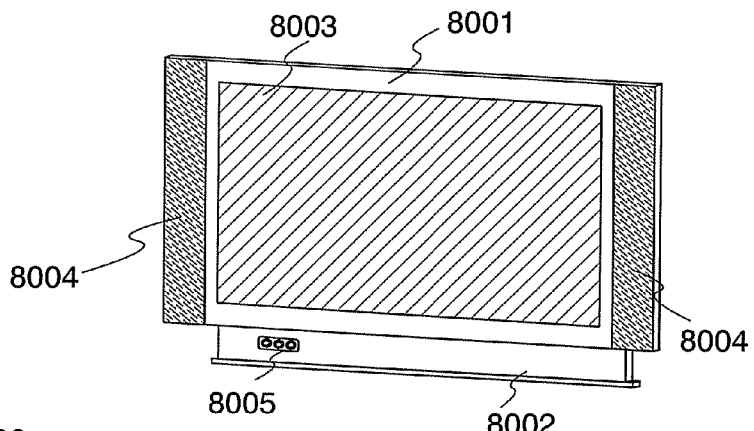
FIGS. 11A to 11E are diagrams showing examples of electronic devices.

FIG. 11A shows a display device, which includes a chassis 8001, a supporting base 8002, a display portion 8003, speaker portions 8004, video input terminals 8005, and the like. The display device is manufactured using a light-emitting device manufactured using the present invention for the display portion 8003. Note that the display device includes all devices for displaying information in its category, for example, devices for a personal computer, for receiving TV broadcasting, and for displaying an advertisement. Application of the present invention makes it possible to increase throughput, and thus productivity in manufacturing the display device can be improved. In addition, loss of materials in manufacturing the display device can be reduced, and thus manufacturing costs can be reduced and inexpensive display devices can be provided.

Figure 11B:
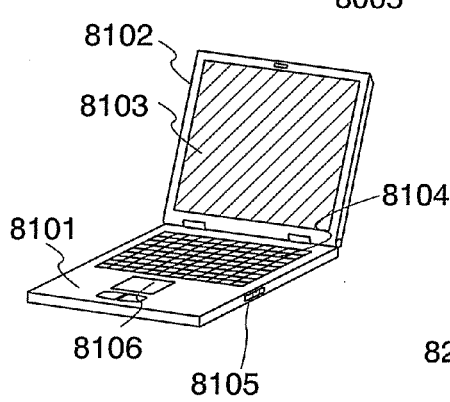

FIG. 11B shows a computer, which includes a main body 8101, a chassis 8102, a display portion 8103, a keyboard 8104, an external connection port 8105, a mouse 8106, and the like. The computer is manufactured using a light-emitting device which is manufactured using the present invention for the display portion 8103. Application of the present invention makes it possible to increase throughput, and thus productivity in manufacturing the display device can be improved. In addition, loss of materials in manufacturing the display device can be reduced, and thus manufacturing cost can be reduced and inexpensive computers can be provided.

Figure 11C:
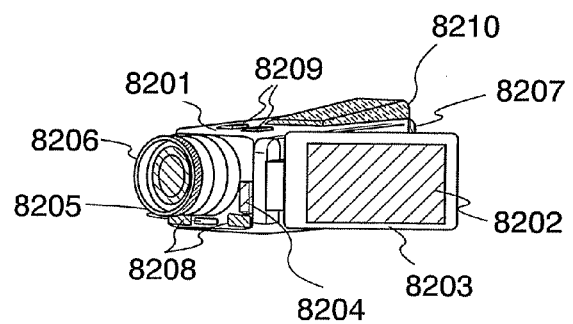

FIG. 11C shows a video camera, which includes a main body 8201, a display portion 8202, a chassis 8203, an external connection port 8204, a remote control receiving portion 8205, an image receiving portion 8206, a battery 8207, an audio input portion 8208, operation keys 8209, an eyepiece portion 8210, and the like. The video camera is manufactured using a light-emitting device which is manufactured using the present invention for the display portion 8202. Application of the present invention makes it possible to increase throughput, and thus productivity in manufacturing the display device can be improved. In addition, loss of materials in manufacturing the display device can be reduced, and thus manufacturing cost can be reduced and inexpensive video cameras can be provided.

Figure 11D:
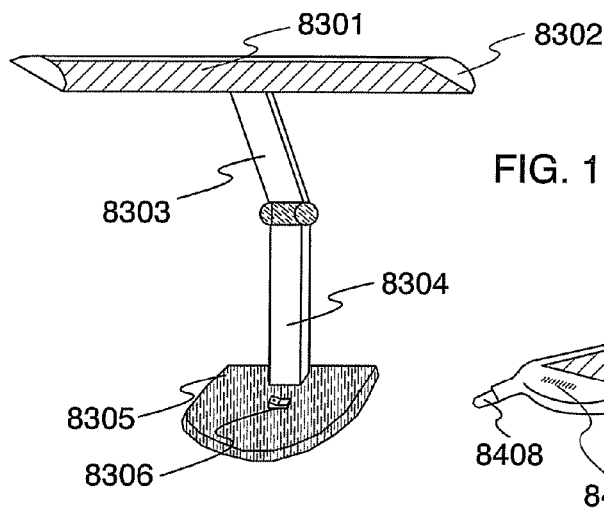

FIG. 11D shows desk lighting equipment, which includes a lighting portion 8301, a shade 8302, an adjustable arm 8303, a support 8304, a base 8305, and a power supply 8306. The desk lighting equipment is manufactured using a light-emitting device which is manufactured using the present invention for the lighting portion 8301. Note that the lighting equipment includes ceiling-fixed lighting equipment, wall-hanging lighting equipment, and the like in its category. Application of the present invention makes it possible to increase throughput, and thus productivity in manufacturing the display device can be improved. In addition, loss of materials in manufacturing the display device can be reduced, and thus manufacturing cost can be reduced and inexpensive desk lighting equipment can be provided.

Figure 11E:
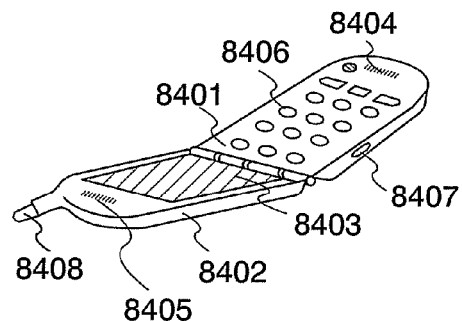

FIG. 11E shows a cellular phone, which includes a main body 8401, a chassis 8402, a display portion 8403, an audio input portion 8404, an audio output portion 8405, operation keys 8406, an external connection port 8407, an antenna 8408, and the like. The cellular phone is manufactured using a light-emitting device which is manufactured using the present invention for the lighting portion 8403. Application of the present invention makes it possible to increase throughput, and thus productivity in manufacturing the display device can be improved. In addition, loss of materials in manufacturing the display device can be reduced, and thus manufacturing cost can be reduced and inexpensive cellular phones can be provided.

In the above-described manner, electronic devices or lighting equipment can be obtained by application of the light-emitting device of the present invention. The application range of the light-emitting device of the present invention is so wide that the light-emitting device can be applied to electronic devices in various fields.

Note that this embodiment mode can be combined with other embodiment modes described in this specification as appropriate.

[Embodiment 1]

In this embodiment, an example of a deposition apparatus which enables manufacture of the light-emitting device of the present invention will be described with reference to FIGS. 12A and 12B, and FIG. 13. Note that FIG. 12A is a cross-sectional view of the deposition apparatus and FIG. 12B is a top view of the deposition apparatus.

Figure 12A:
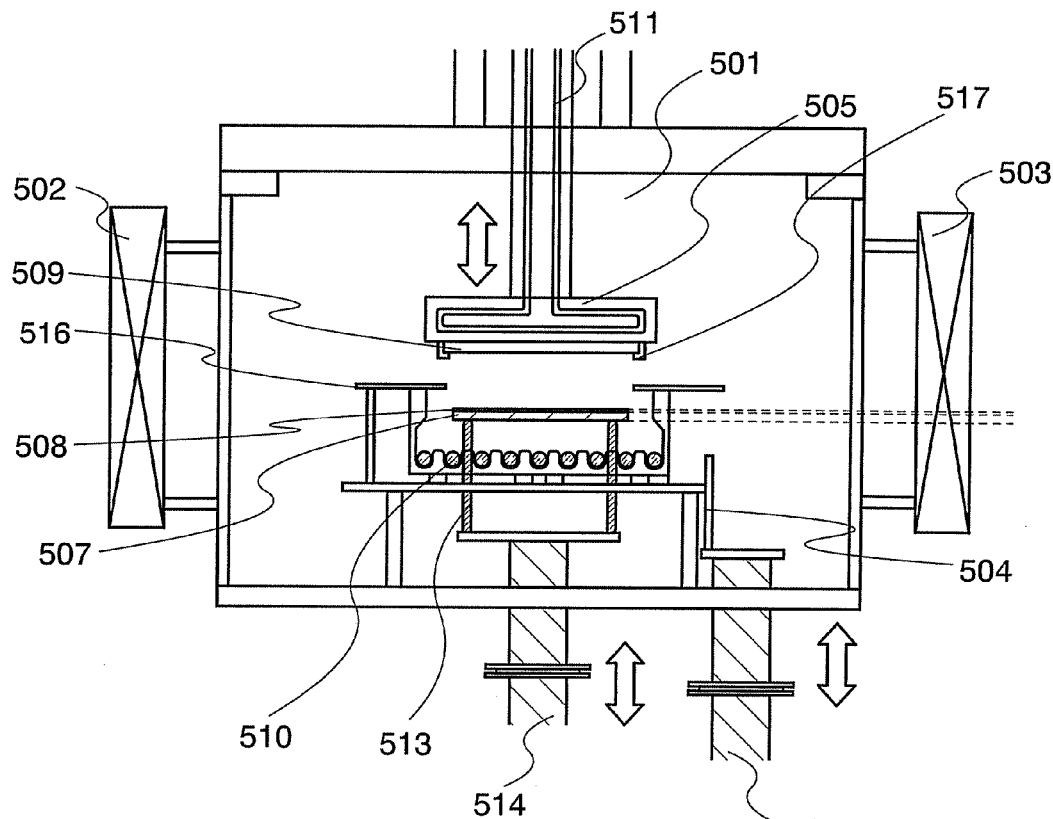
FIGS. 12A and 12B are views showing an example of a deposition apparatus.
Figure 12B:
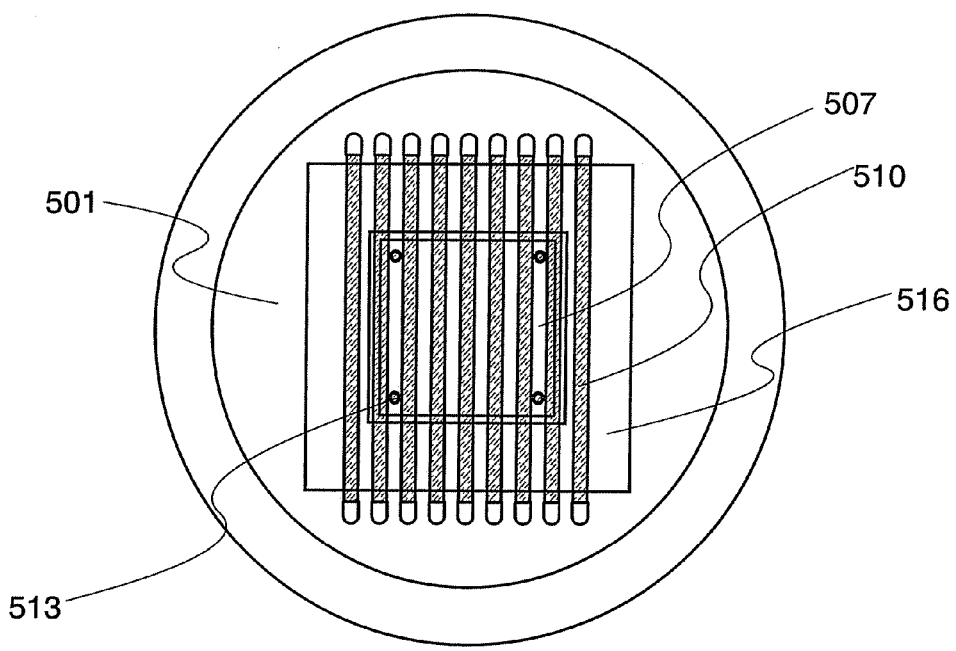

In FIGS. 12A and 12B, a deposition chamber 501 is a vacuum chamber and is connected to other treatment chambers via a first gate valve 502 and a second gate valve 503. The deposition chamber 501 includes a substrate supporting unit 513 which is a first substrate supporting unit, a deposition substrate supporting unit 505 which is a second substrate supporting unit, and a halogen lamp 510 as a heat source. The halogen lamp is capable of rapid heating. The halogen lamp can also control heating of the first substrate by change of the interval of time for emitting light. In addition, since the halogen lamp is capable of rapid heating, a raising and lowering mechanism, a shutter, and the like which are used in the case of using a heater can be simplified. Thus, further reduction in the size of the deposition apparatus can be achieved.

First, in another deposition chamber, a material layer 508 is formed over a first substrate 507 which is a supporting substrate. In this embodiment, a glass substrate over which a titanium film is formed is used as the first substrate 507. Titanium can efficiently absorb light having an emission wavelength of about 1100 to 1200 nm corresponding to the emission wavelength of the halogen lamp which is a heat source; thus the material layer 508 formed over the titanium film can be efficiently heated. As the material layer 508, a layer in which a plurality of materials which are capable of being evaporated and the evaporation temperatures of which are different from each other is used. Note that, in this embodiment, a substrate which has the same area as the formation substrate is used as the first substrate 507. In this embodiment, in the material layer 508, a layer containing metal oxide is stacked by a wet process over a layer containing a substance with a high hole transporting property. It is difficult to dissolve the metal oxide and the substance having a high hole transporting property in the same solvent and to control this mixed solution; thus, it is difficult to directly form a mixed layer by a wet process. Thus, it is easy to stack the layer containing metal oxide on the layer containing a substance with a high hole transporting property by a wet process. Thus, the mixed layer can be easily formed by the deposition method of the present invention.

As indicated by dotted lines in FIG. 12A, the first substrate 507 is transferred to the deposition chamber 501 from another deposition chamber and is set on the substrate supporting unit 513. At the time of the transfer, a reflector shutter 504 is opened by a movable unit 515, and the first substrate 507 is set on the substrate supporting unit 513 through the opened shutter 504. The first substrate 507 is fixed to the first substrate supporting unit 513 so that a surface of the first substrate 507, over which the material layer 508 is formed, faces a deposition surface of a second substrate 509 which is a deposition substrate.

The deposition chamber 501 is desirably vacuum-evacuated. Specifically, the deposition chamber 501 is vacuum-evacuated to less than or equal to $5 \times 10^{-3}$ Pa, preferably the range from about $10^{-4}$ to about $10^{-6}$ Pa. As a vacuum evacuation unit which is connected to the deposition chamber, an oil-free dry pump is used when vacuum evacuation of from the atmospheric pressure to a pressure on the order of 1 Pa is performed, whereas a magnetic floating turbo molecular pump or a compound molecular pump is used when vacuum evacuation of a pressure lower than the above-described range is performed. This prevents contamination by an organic substance from the evacuation unit, such as mainly oil. Mirror treatment is performed on an inner wall surface by electrolytic polishing to reduce the surface area, and accordingly gas is prevented from being discharged.

The second substrate 509 is fixed on the deposition substrate supporting unit 505 by a fixing unit 517. The deposition substrate supporting unit 505 includes a tube 511 through which a heat medium flows. The tube 511 through which a heat medium flows enables the deposition substrate supporting unit 505 to maintain the appropriate temperature. For example, cold water may be flown through the tube 511 to cool the deposition substrate, or hot water may be flown therethrough to heat the deposition substrate.

Figure 13:
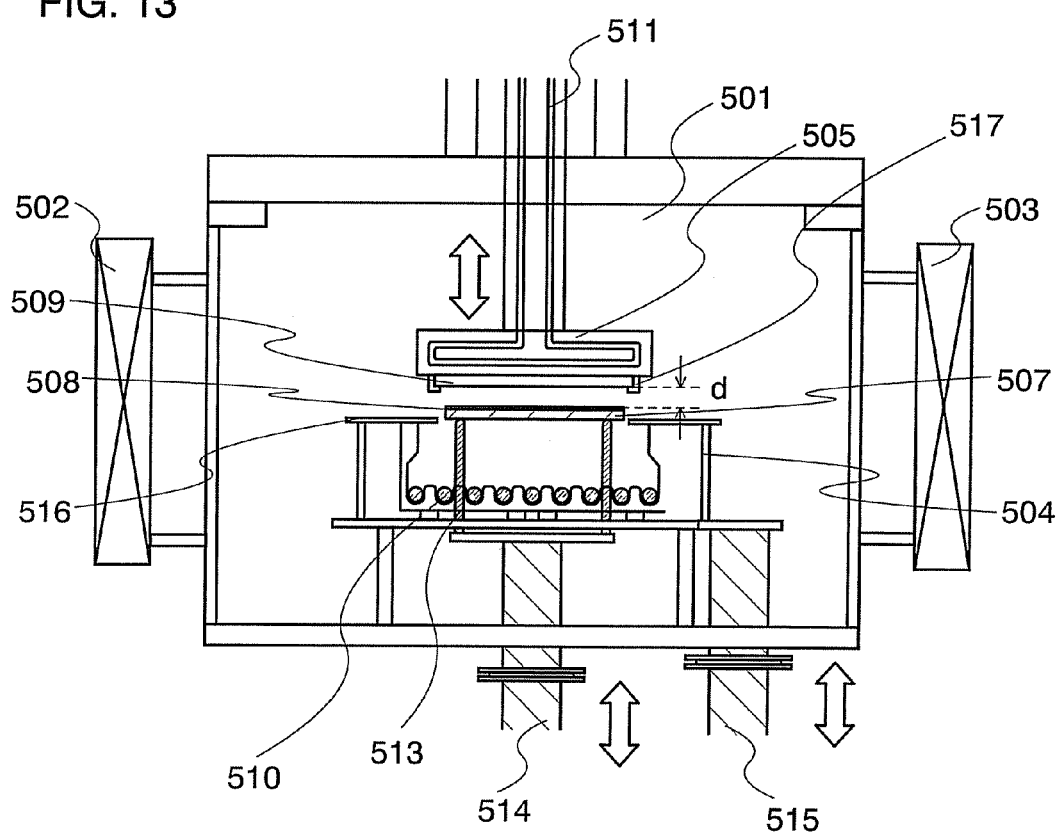
FIG. 13 is a view showing an example of a deposition apparatus.

Next, as shown in FIG. 13, the first substrate 507 and the second substrate 509 are brought close to each other so that the distance therebetween becomes the distance d. Note that the distance d is defined as the distance between a surface of the material layer 508 formed over the first substrate 507 and a surface of the second substrate 509. In addition, in the case where a certain layer (e.g., a conductive layer which functions as an electrode or an insulating layer which functions as a partition wall) is formed on the second substrate 509, the distance d is defined as the distance between the surface of the material layer 508 over the first substrate 507 and the surface of the layer formed on the second substrate 509. Note that the surface of the second substrate 509 or the surface of the layer formed on the second substrate 509 is uneven, the distance d is defined as the shortest distance between the surface of the material layer 508 over the first substrate 507 and the outermost surface of the second substrate 509 or the layer formed on the second substrate 509. In this embodiment, the distance d is set to 1 mm.

In addition, as for the deposition apparatus described in this embodiment mode, the distance between the substrates is controlled by up-and-down movement of the deposition substrate supporting unit 505 or by up-and-down movement of substrate lift pins which constitute the first substrate supporting unit 513 with the first substrate 507 lifted up. The substrate lift pins made of quartz are moved up and down by the movable unit 514 to lift up the first substrate 507.

In this embodiment, the distance between the first substrate 507 (supporting substrate) and the halogen lamp 510 which is a heat source is set to 50 mm at the time of waiting (before an evaporation process), in order to reduce thermal effects on the material layer 508 formed over the supporting substrate due to heat radiation from the heat source (heater) at the time of waiting.

Heat treatment is performed using the halogen lamp 510 while retaining the distance d between the substrates. First, for preheating, an output of the halogen lamp 810 is maintained at a temperature of 60° C. for 15 seconds. The preheating stabilizes the output of the halogen lamp 510. After that, heat treatment is performed. The heat treatment maintains a temperature of 500 to 800° C. for 7 to 15 seconds. Since time required for the heat treatment varies depending on an evaporation material, the time is appropriately set. A reflector 516 and the reflector shutter 504 are provided so that the whole deposition chamber is not heated by scattering of light from the halogen lamp 510.

The titanium film formed over the first substrate 507 absorbs light from the halogen lamp 510 to be heated; accordingly, the material layer 508 over the titanium film is heated to be vaporized, and then an evaporation material is formed on a deposition surface (i.e., a lower flat surface) of the second substrate 509, which is placed so as to face the surface of the material layer 508. When the deposition apparatus shown in FIGS. 12A and 12B, and FIG. 13 is used, if the material layer 508 with a uniform thickness is formed over the first substrate 507 in advance, deposition of a film with high uniformity of the thickness can be performed on the second substrate 509 without a film-thickness monitor. A substrate is rotated in a conventional evaporation apparatus. In contrast, the deposition substrate is fixed for deposition in the deposition apparatus shown in FIGS. 12A and 12B, and FIG. 13, and thus this deposition apparatus is suitable for deposition on a large-area glass substrate which is easily broken.

The light-emitting device of the present invention can be manufactured by the deposition apparatus described in this embodiment. In the present invention, an evaporation source can be easily prepared by a wet process. In addition, since the evaporation source can be evaporated as it is, a film-thickness monitor is not needed. Thus, the deposition process can be fully automated and throughput can be increased. Moreover, an evaporation material can be prevented from being attached to an inner wall of the deposition chamber, and thus maintenance of the deposition apparatus can be easier.

This application is based on Japanese Published Patent Application serial No. 2007-179085 filed with Japan Patent Office on Jul. 6, 2007, the entire contents of which are hereby incorporated by reference.

What is claimed is:

1. A method for manufacturing a light-emitting device comprising:
    forming a first layer containing a first evaporation material over a first substrate;
    forming a second layer containing a second evaporation material over the first layer;
    forming a third layer containing the first evaporation material over the second layer;
    forming a fourth layer containing the second evaporation material over the third layer;
    placing another substrate provided with a first electrode so as to face the first substrate;
    heating the first substrate to form a layer containing the first evaporation material and the second evaporation material over the first electrode; and
    forming a second electrode over the layer containing the first evaporation material and the second evaporation material.

2. The method for manufacturing a light-emitting device according to claim 1, wherein an evaporation temperature of the first evaporation material is lower than an evaporation temperature of the second evaporation material.

3. The method for manufacturing a light-emitting device according to claim 1, wherein the first evaporation material contains an organic substance and the second evaporation material contains an inorganic substance.

4. The method for manufacturing a light-emitting device according to claim 1, wherein the first layer is formed by a wet process.

5. The method for manufacturing a light-emitting device according to claim 1, wherein the second layer is formed by a wet process.

6. The method for manufacturing a light-emitting device according to claim 1, wherein the light-emitting device is incorporated in one selected from the group consisting of a display device, a computer, a camera, a lighting equipment, and a telephone.

7. A method for manufacturing a light-emitting device comprising:
    forming a first layer containing a first evaporation material over a conductive substrate;
    forming a second layer containing a second evaporation material over the first layer;
    forming a third layer containing the first evaporation material over the second layer;
    forming a fourth layer containing the second evaporation material over the third layer;
    placing another substrate provided with a first electrode so as to face the conductive substrate;
    heating the conductive substrate by passing a current through the conductive substrate to form a layer containing the first evaporation material and the second evaporation material over the first electrode; and
    forming a second electrode over the layer containing the first evaporation material and the second evaporation material.

8. The method for manufacturing a light-emitting device according to claim 7, wherein an evaporation temperature of the first evaporation material is lower than an evaporation temperature of the second evaporation material.

9. The method for manufacturing a light-emitting device according to claim 7, wherein the first evaporation material contains an organic substance and the second evaporation material contains an inorganic substance.

10. The method for manufacturing a light-emitting device according to claim 7, wherein the first layer is formed by a wet process.

11. The method for manufacturing a light-emitting device according to claim 7, wherein the second layer is formed by a wet process.

12. The method for manufacturing a light-emitting device according to claim 7, wherein the light-emitting device is incorporated in one selected from the group consisting of a display device, a computer, a camera, a lighting equipment, and a telephone.

* * * * *

UNITED STATES PATENT AND TRADEMARK OFFICE
CERTIFICATE OF CORRECTION

| | | |
|---|---|---|
| PATENT NO. | : 8,551,557 B2 | Page 1 of 1 |
| APPLICATION NO. | : 12/166002 | |
| DATED | : October 8, 2013 | |
| INVENTOR(S) | : Ikeda et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 793 days.

Signed and Sealed this
Tenth Day of March, 2015

Michelle K. Lee
*Deputy Director of the United States Patent and Trademark Office*